(12) United States Patent
Blank

(10) Patent No.: US 9,960,270 B2
(45) Date of Patent: May 1, 2018

(54) SEMICONDUCTOR DEVICES AND METHOD FOR MANUFACTURING SEMICONDUCTOR DEVICES

(71) Applicant: Infineon Technologies Austria AG, Villach (AT)

(72) Inventor: Oliver Blank, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days. days.

(21) Appl. No.: 15/593,394

(22) Filed: May 12, 2017

(65) Prior Publication Data

US 2017/0338338 A1 Nov. 23, 2017

(30) Foreign Application Priority Data

May 13, 2016 (DE) .......................... 10 2016 108 949

(51) Int. Cl.

| | | |
|---|---|---|
| *H01L 29/78* | (2006.01) | |
| *H01L 29/66* | (2006.01) | |
| *H01L 29/40* | (2006.01) | |
| *H01L 23/535* | (2006.01) | |
| *H01L 21/768* | (2006.01) | |

(52) U.S. Cl.
CPC .... *H01L 29/7813* (2013.01); *H01L 21/76897* (2013.01); *H01L 23/535* (2013.01); *H01L 29/407* (2013.01); *H01L 29/66734* (2013.01)

(58) Field of Classification Search
CPC ....... H01L 29/40; H01L 29/407; H01L 29/66; H01L 29/667; H01L 29/6673; H01L 29/66734; H01L 29/78; H01L 29/781; H01L 29/7813; H01L 23/53; H01L 23/535; H01L 21/76; H01L 21/768; H01L 21/7689; H01L 21/76897
USPC .......................................................... 257/330
See application file for complete search history.

(56) References Cited

U.S. PATENT DOCUMENTS

| | | | |
|---|---|---|---|
| 2013/0134505 A1* | 5/2013 | Kobayashi | ........ H01L 29/66348 257/330 |
| 2016/0149028 A1* | 5/2016 | Jin | ....................... H01L 21/2652 257/329 |

FOREIGN PATENT DOCUMENTS

| | | |
|---|---|---|
| DE | 10014660 A1 | 10/2001 |
| DE | 102013103099 A1 | 9/2013 |
| DE | 102013108614 A1 | 2/2014 |

* cited by examiner

*Primary Examiner* — Monica D Harrison
(74) *Attorney, Agent, or Firm* — Murphy, Bilak & Homiller, PLLC

(57) ABSTRACT

A method for manufacturing a semiconductor device includes: forming a recess in a semiconductor substrate, the recess having a bottom and a sidewall extending from the bottom to a first side of the semiconductor substrate; forming an auxiliary structure on the sidewall and the bottom of the recess and forming a hollow space within the recess; filling the hollow space with a filling material; forming a plug on the first side of the semiconductor substrate to cover the auxiliary structure at least on the sidewall of the recess; forming an opening in the plug to partially expose the auxiliary structure in the recess; removing the auxiliary structure at least partially from the sidewall of the recess to form cavities between the auxiliary structure and the sidewall; and sealing the opening in the plug.

24 Claims, 19 Drawing Sheets

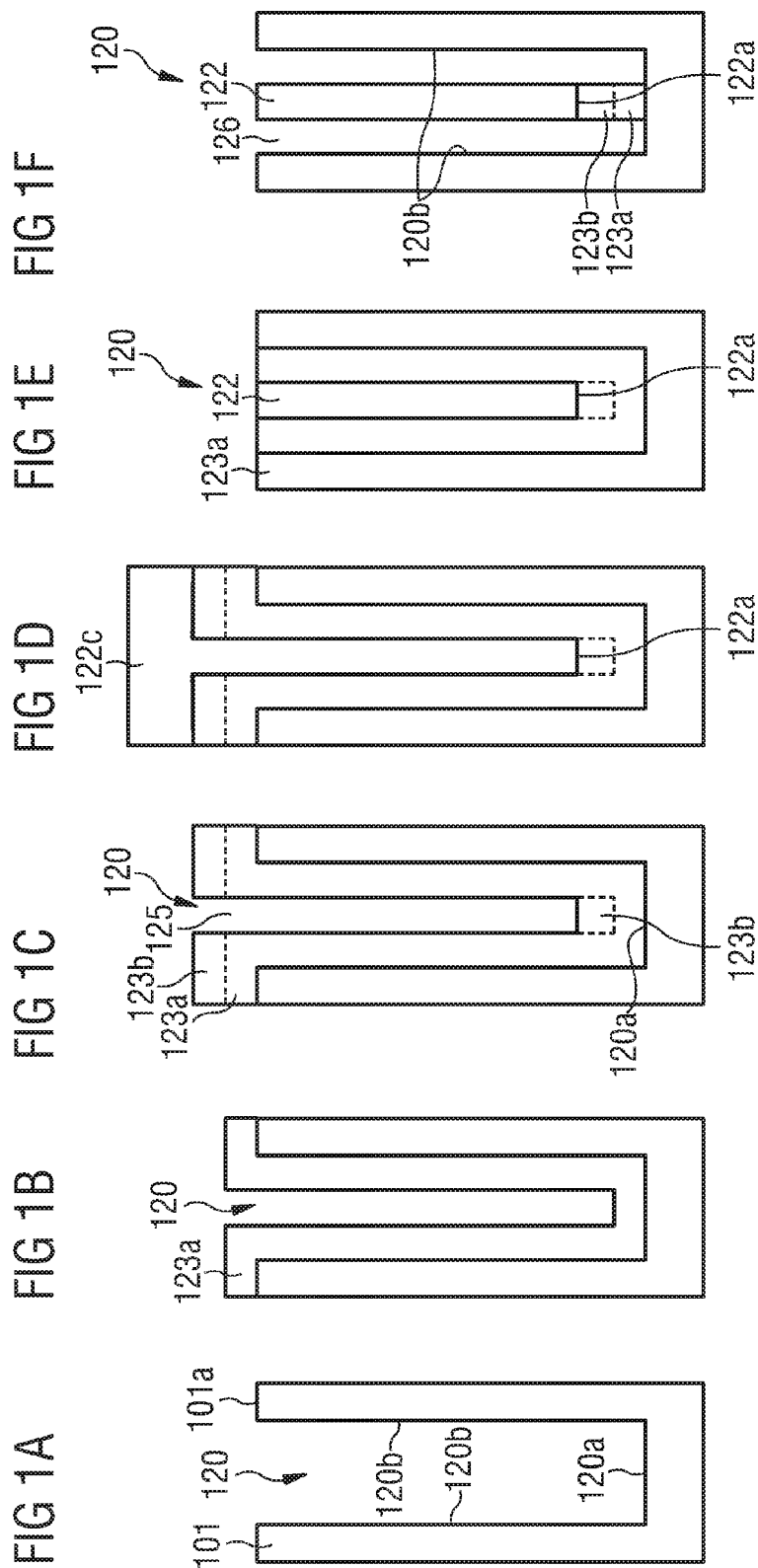

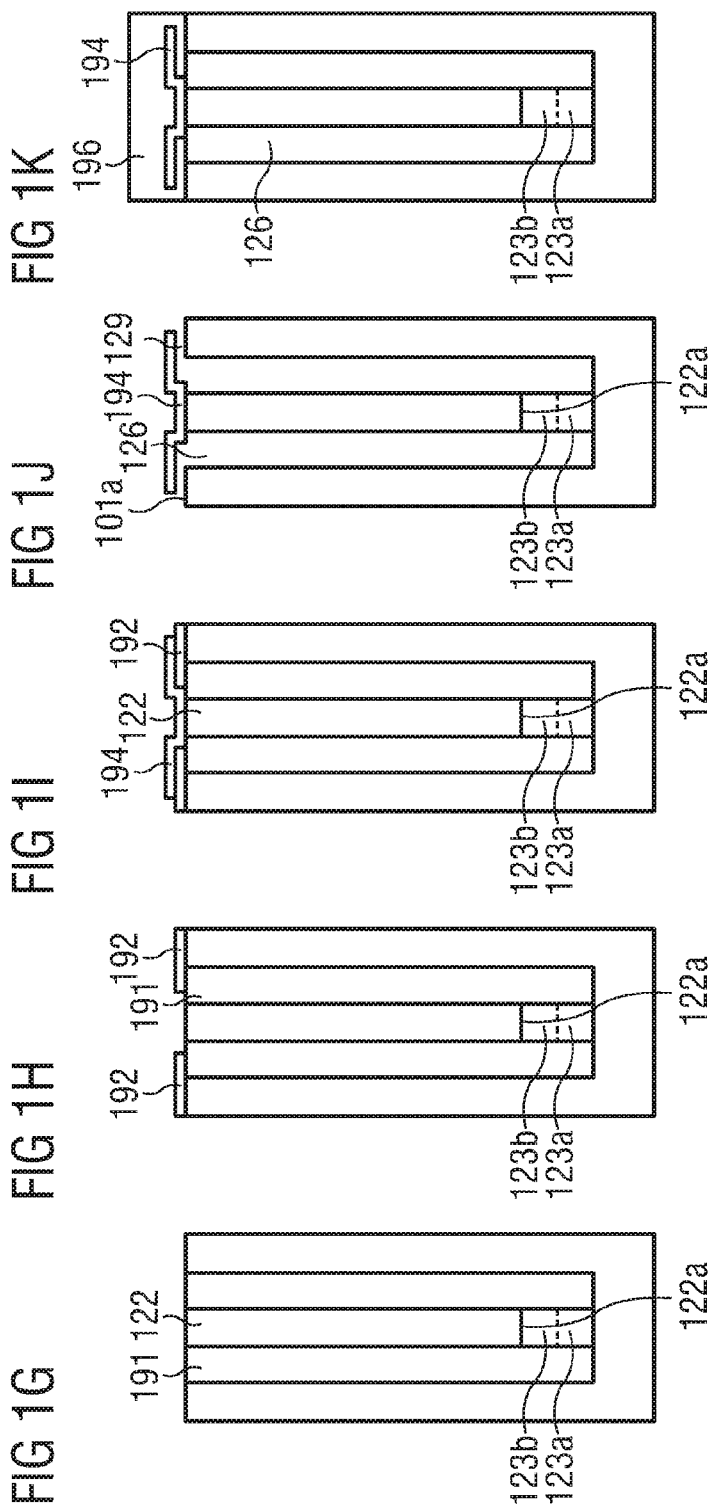

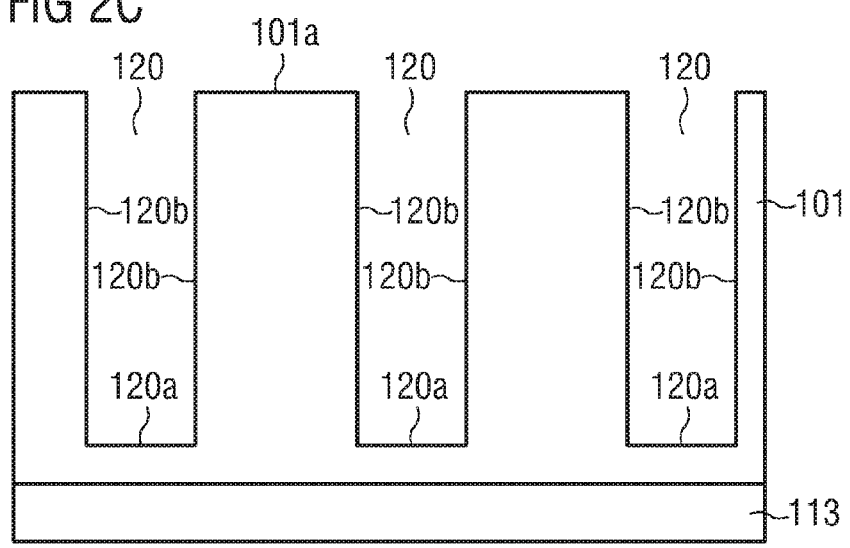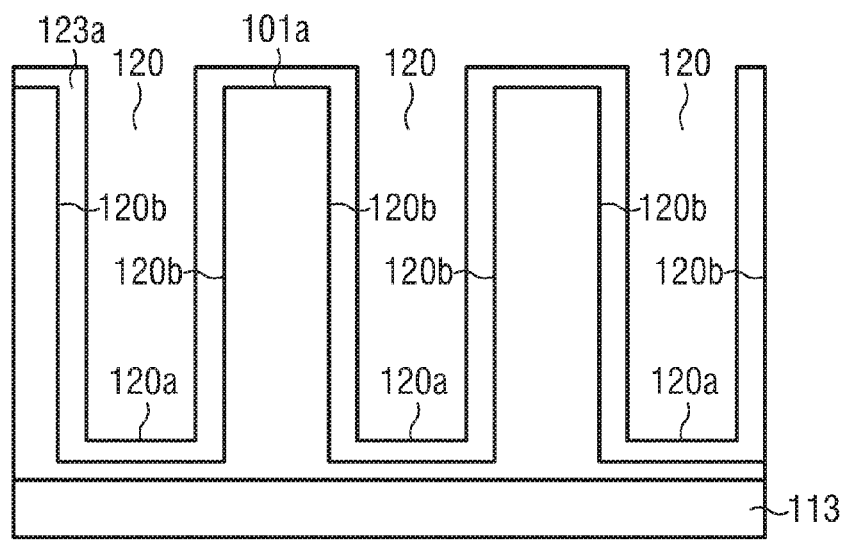

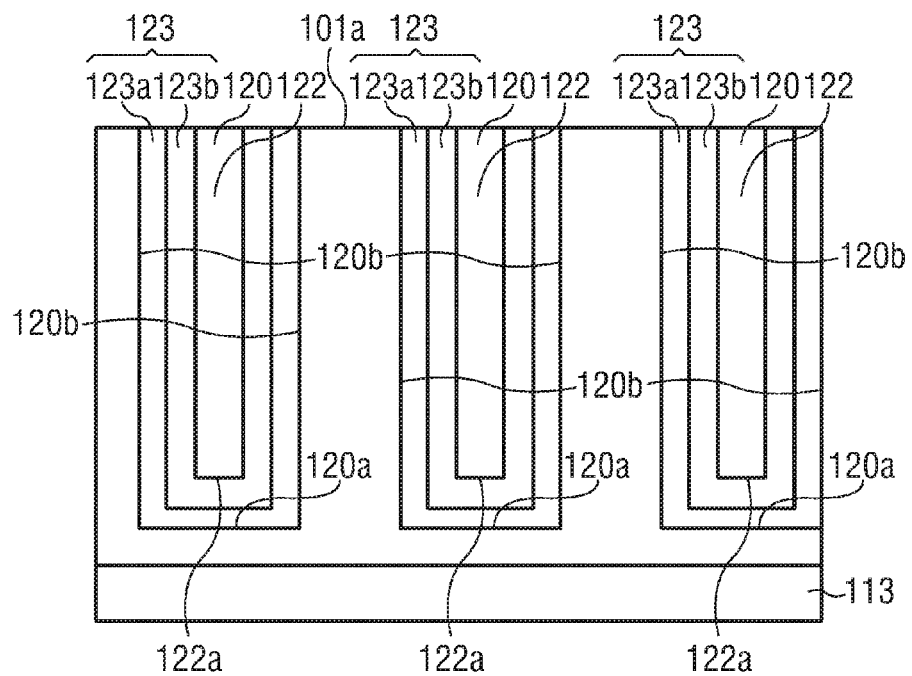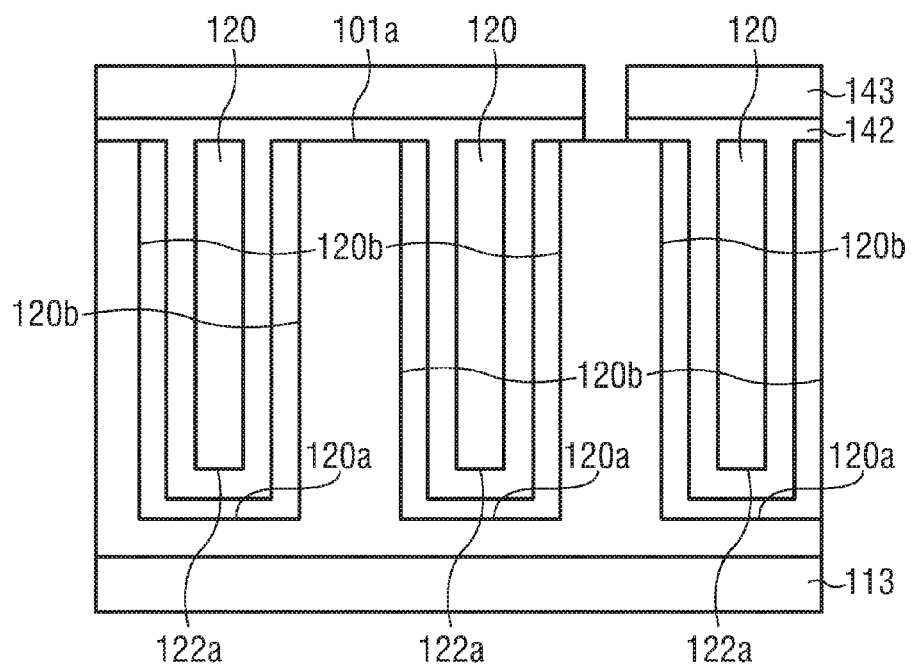

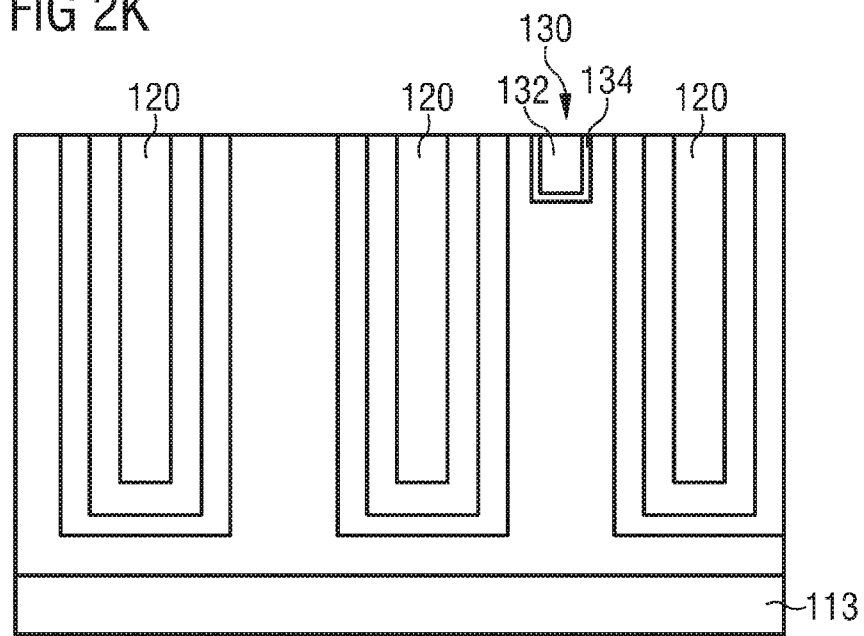
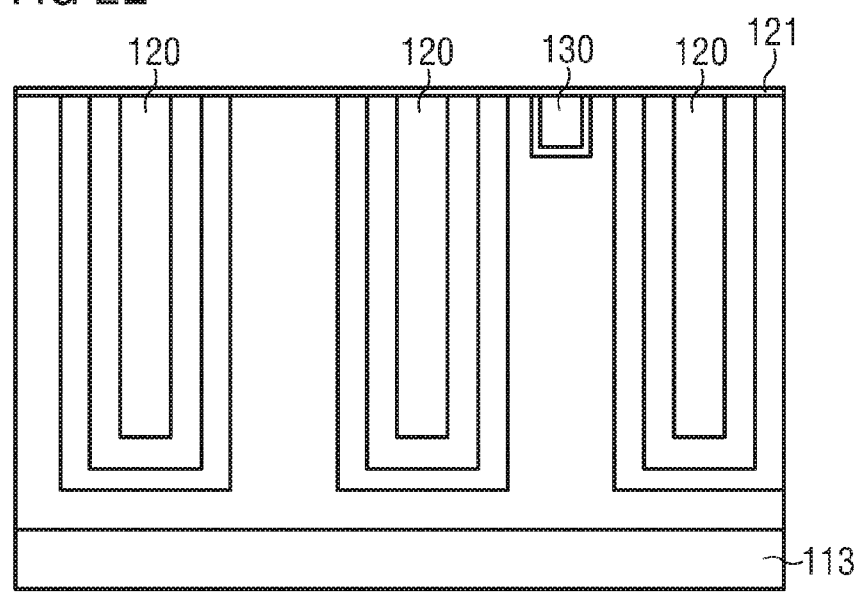

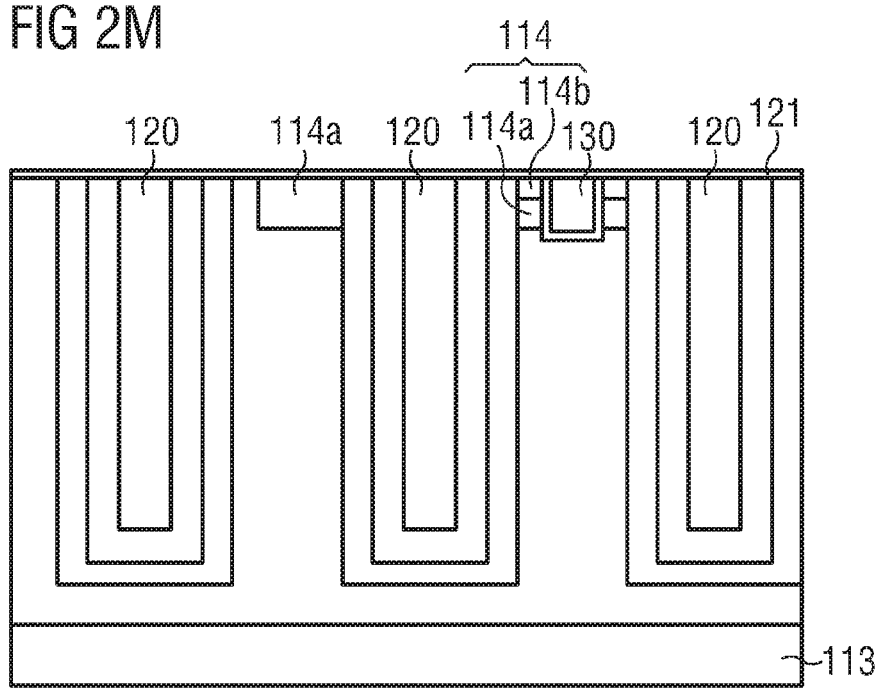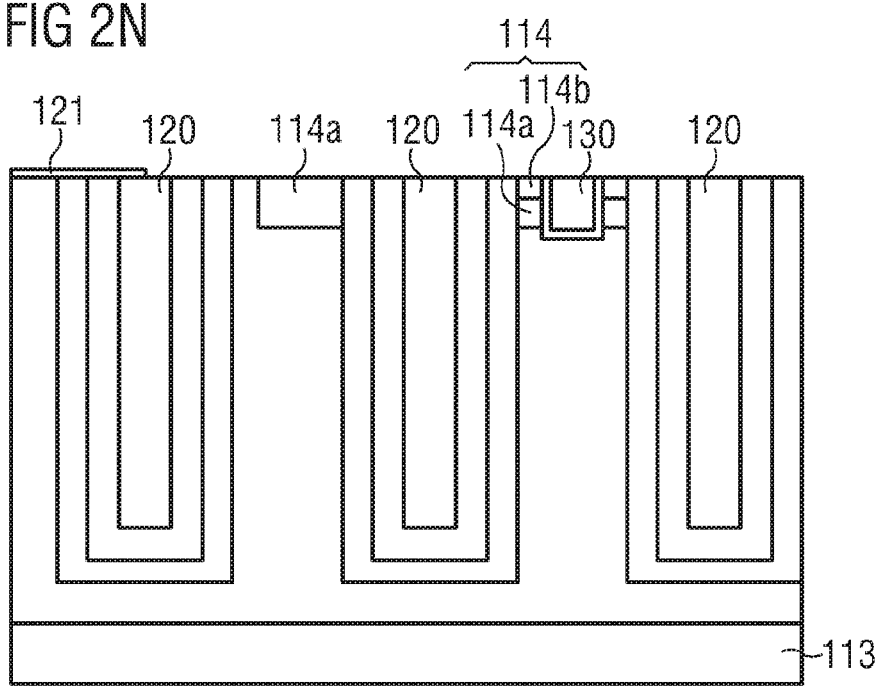

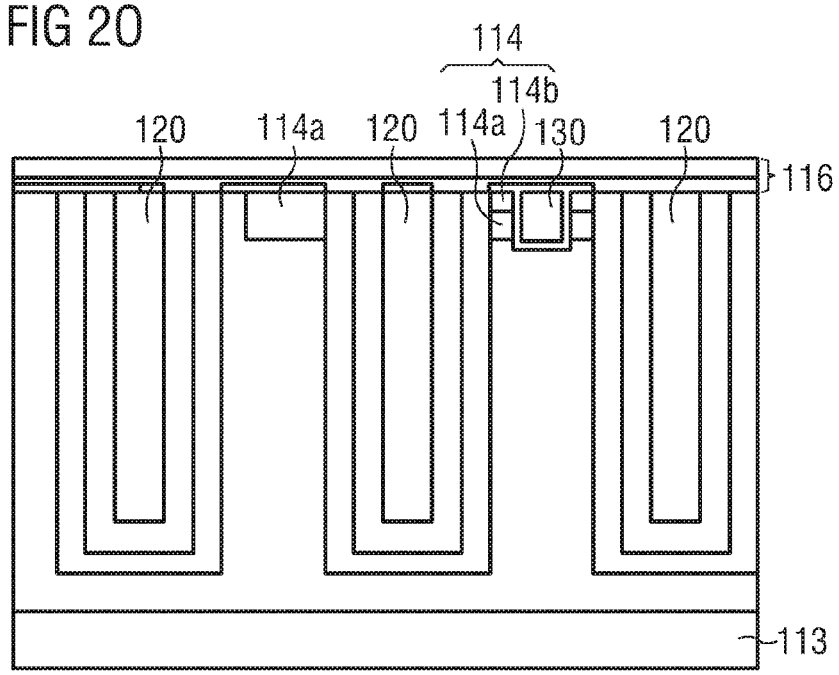
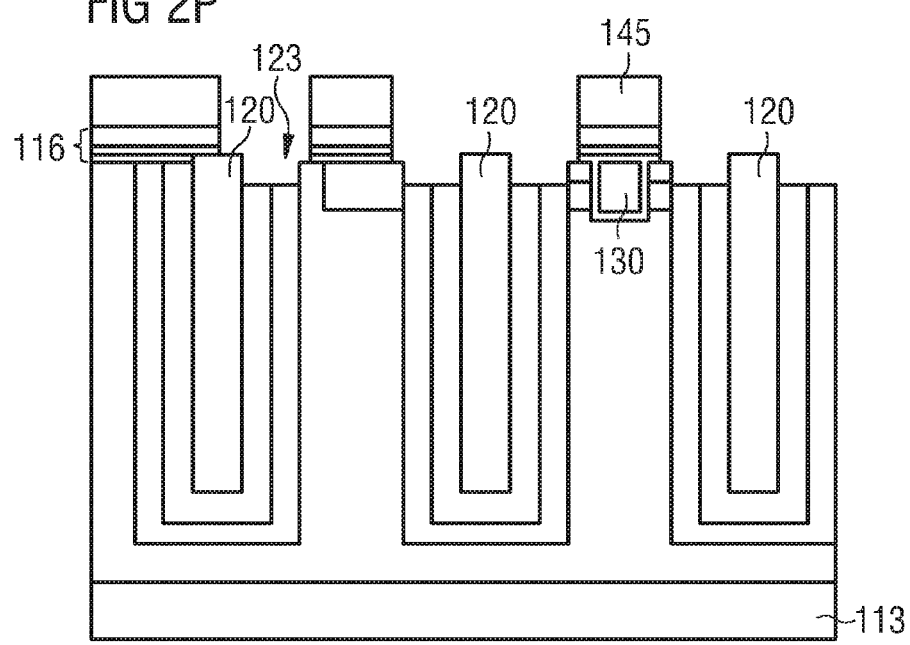

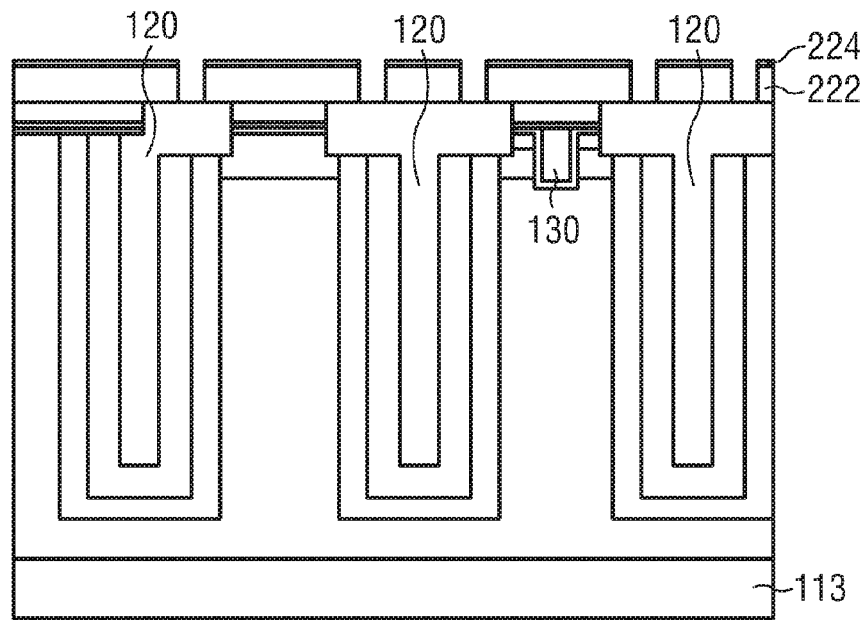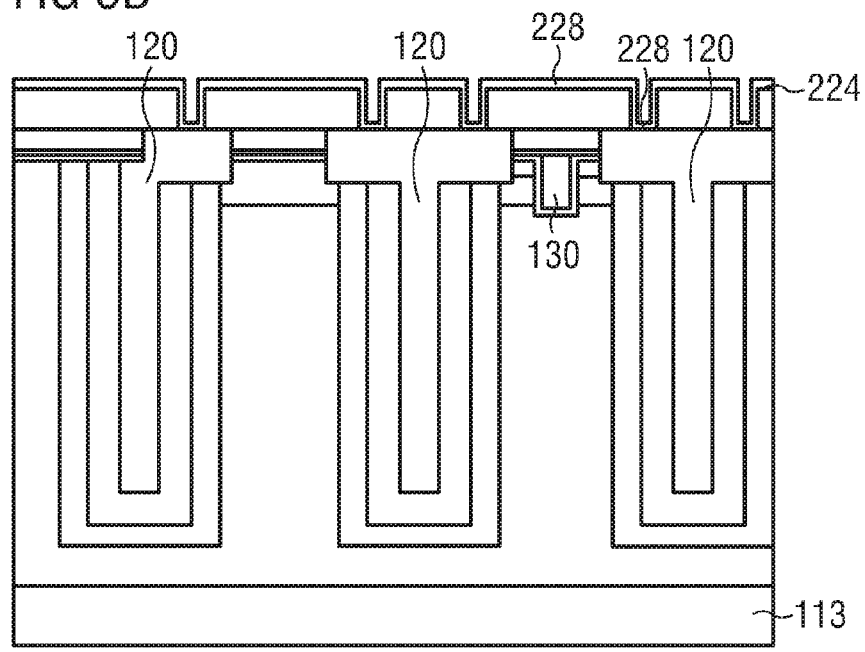

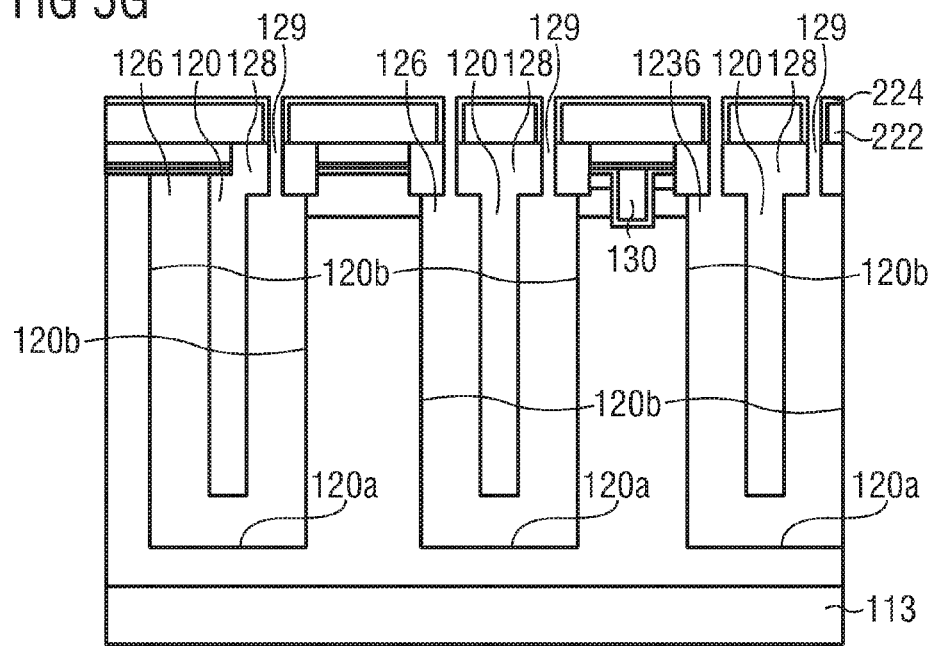
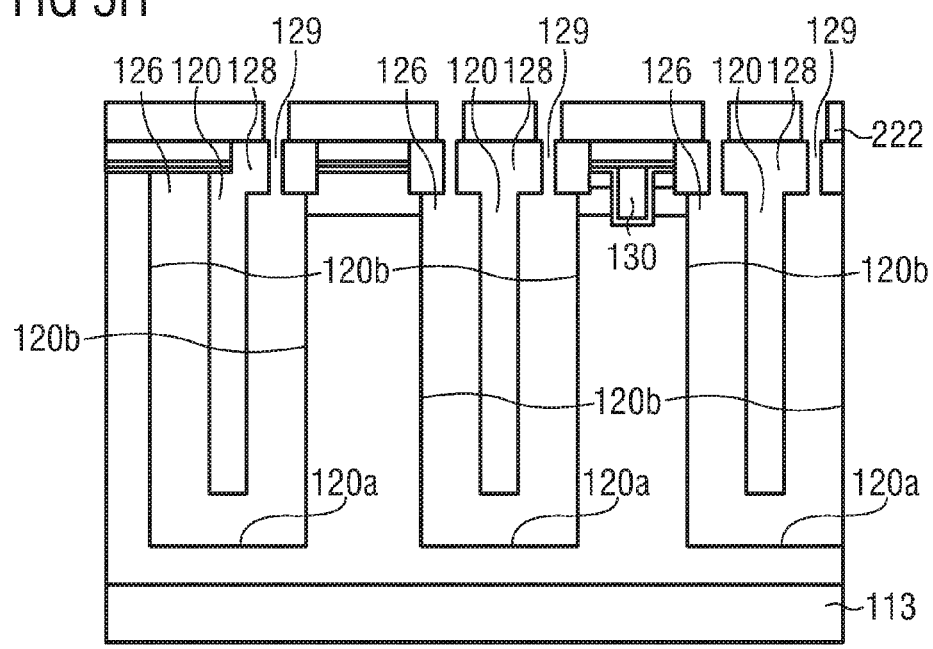

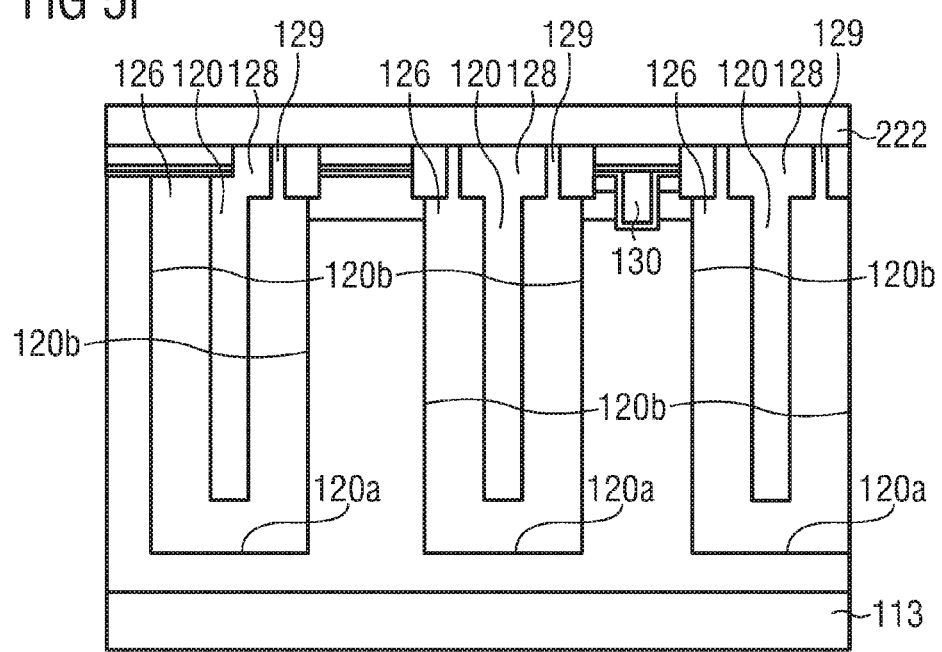

SEMICONDUCTOR DEVICES AND METHOD FOR MANUFACTURING SEMICONDUCTOR DEVICES

TECHNICAL FIELD

Embodiments described herein relate to methods for forming semiconductor devices having cavities. Further embodiments described herein relate to semiconductor devices having such cavities.

BACKGROUND

Conducting structures integrated into semiconductor devices needs to be electrically insulated from other parts of the device to ensure reliable functioning of the semiconductor device. Examples of such conducting structures are field electrodes and gate electrodes which are insulated from the semiconductor substrate by insulation layers such as oxide layers. As comparably high voltages may occur between field electrodes and the semiconductor substrate during operation of the semiconductor device, the insulation layer needs to be thick to prevent electrical breakdown. However, thick insulation layers need more space and increases the size of the respective device.

In view of the above, there is a need for improvement.

SUMMARY

According to an embodiment, a method for manufacturing a semiconductor device is provided. The method includes: providing a semiconductor substrate having a first side; forming at least one recess in the semiconductor substrate, the at least one recess having a bottom and a sidewall extending from the bottom to the first side of the semiconductor substrate; forming an auxiliary structure on the sidewall and the bottom of the at least one recess and forming a hollow space within the at least one recess; filling the hollow space of the at least one recess with a filling material; forming at least one plug on the first side of the semiconductor substrate to cover the auxiliary structure at least on the sidewall of the at least one recess; forming at least one opening in the at least one plug to partially expose the auxiliary structure in the at least one recess; removing the auxiliary structure at least partially from the sidewall of the at least one recess to form cavities between the auxiliary structure and the sidewall of the at least one recess; and sealing the at least one opening in the at least one plug.

According to a further embodiment, a power semiconductor device is provided. The power semiconductor device includes: a semiconductor substrate having a drift region; at least one gate electrode trench in the semiconductor substrate, extending into the drift region and comprising a gate electrode, the gate electrode arranged in the gate electrode trench and electrically insulated from the drift region by a gate dielectric layer arranged between the gate electrode and the drift region; and at least one field electrode needle trench in the semiconductor substrate, laterally spaced from the gate electrode trench and extending into the drift region, the at least one field electrode needle trench comprising a field electrode arranged in the at least one field electrode needle trench and electrically insulated from the drift region by a cavity formed field electrode needle trench between the field electrode and the drift region.

According to yet a further embodiment, a power semiconductor device is provided. The power semiconductor device includes: a semiconductor substrate having a drift region and a body region; at least one field electrode needle trench in the semiconductor substrate extending into the drift region, the at least one field electrode needle trench comprising a field electrode arranged in the at least one field electrode needle trench and electrically insulated from the drift region by a cavity formed between the field electrode and the drift region; at least one electrically conductive plug arranged in an upper portion of the at least one field electrode needle trench and partially closing the cavity on a laterally first side, the at least one electrically conductive plug being in electrical contact with the body region; and at least one auxiliary plug arranged in an upper portion of the at least one field electrode needle trench and closing the cavity on a laterally second side, wherein the electrically at least one conductive plug and the at least one auxiliary plug forming together at least one plug for completely closing the cavity.

Those skilled in the art will recognise additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference signs designate corresponding parts. In the drawings:

FIGS. 1A to 1K illustrate processes according to an embodiment.

FIGS. 5A to 5I illustrate, in a cross-sectional view of a semiconductor substrate, further processes according to an embodiment.

DETAILED DESCRIPTION

Figure 2A:
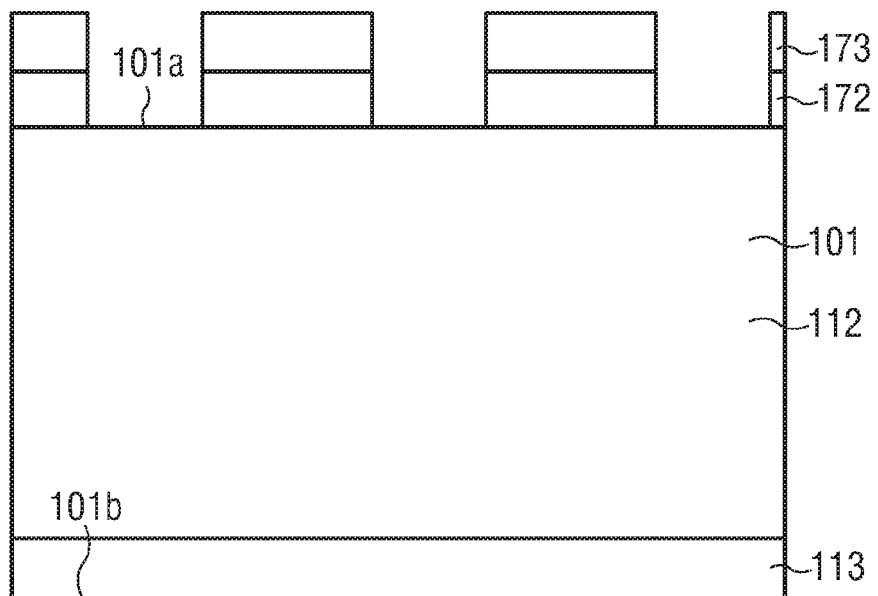
FIGS. 2A to 2R illustrate, in a cross-sectional view of a semiconductor substrate, further processes according to an embodiment.

In the following Detailed Description, reference is made to the accompanying drawings, which form a part hereof, and in which are shown by way of illustration specific embodiments in which the invention may be practiced. In this regard, directional terminology, such as "top", "bottom", "front", "back", leading". "trailing", "lateral", "vertical" etc., is used with reference to the orientation of the Figure(s) being described. These terms are intended to encompass different orientations of the device in addition to different orientations than those depicted in the figures. Because components of embodiments can be positioned in a number of different orientations, the directional terminology is used for purpose of illustration and is in no way limiting. Further, terms such as "first", "second", and the like, are also used to describe various elements, regions, sections, etc. and are also not intended to be limiting. Like terms refer to like elements throughout the description. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

In this specification, a second surface of a semiconductor substrate is considered to be formed by the lower or backside surface while a first surface is considered to be formed by the upper, front or main surface of the semiconductor substrate. The terms "above" and "below" as used in this specification therefore describe a relative location of a structural feature to another structural feature with consideration of this orientation.

The terms "electrical connection" and "electrically connected" describes an ohmic connection between two elements.

Some embodiment are described next with reference to the Figures. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

FIGS. 1A to 1K illustrate processes according to an embodiment.

FIG. 1A shows a portion of a semiconductor substrate 101 in which a recess 120 is formed. Specifically, the substrate 101 can have a first side 101a in which the recess 120 can be formed. The recess 120 can be formed by photolithographic techniques including pattering a photoresist and etching techniques. The recess 120 can have a bottom 120a and a sidewall 120b extending from the bottom 120a to the first side 101a of the substrate 101

As shown in FIG. 1B, an oxide layer 123a can be deposited in the recess 120. For instance, the oxide can be deposited conformally in the recess 120. Further, the oxide can be deposited on the sidewall 120b and the bottom 120a of the recess 120. The oxide layer 123a can be regarded as a first auxiliary material that forms a first insulating layer.

Continuing with FIG. 1C, a HDP layer 123b, i.e. a layer formed by HDP CVD (high-density plasma chemical vapour deposition), can be formed on the oxide layer 123a. The oxide layer 123a and the HDP layer 123b can form an auxiliary structure 123. Specifically, the HDP layer 123b can be formed on the bottom 120a of the recess 120 to increase a thickness of the auxiliary structure 123 at the bottom 120a of the recess 120. According to some embodiments, the auxiliary structure 123 can be formed such to keep a hollow space 125 within the recess 120. The hollow space 125 is laterally bounded by the auxiliary structure 123, particularly by the oxide layer 123a. At its lower end toward the bottom 120a of the recess 120, the hollow space 125 is bounded by the auxiliary structure 123, particularly by the HDP layer 123b.

The HDP layer 123b, as illustrated in FIG. 1C, is mainly deposited on horizontal surfaces of the oxide layer 123a to increase the thickness of portions of the oxide layer 123a that have a horizontal surface. The horizontal surface is substantially parallel to the plane formed by the first side 101a of the semiconductor substrate 101. The HDP layer 123b can be considered to form a second auxiliary material that forms a second insulating layer.

According to an embodiment, each of the first and second auxiliary materials or layers 123a, 123b can be formed by a conductive material. Typically, the first and second auxiliary layers 123a, 123b can be formed by the same conductive or insulating material which is deposited by different processes. An interface may be observable between the first and the second auxiliary layers 123a, 123b. The interface is indicated by a dotted line in FIG. 1C.

Next, as shown in FIG. 1D, the hollow space 125 of the recess 120 can be filled with a filling material 122c, specifically for forming a filling structure 122 in the recess 120. The filling structure 122 can have a lower end 122a opposite, and specifically spaced from, the bottom 120a of the recess 120. The filling structure 122 can be formed, e.g., by depositing the filling material 122c on the first side 101a of the substrate 101 to fill the recess 120. According to embodiments, the filling material 122c can be an electrically conductive material, such as a polycrystalline semiconductor material, e.g. as poly-Si, for forming respective electrically conducting structures 122 in the recess 120.

As shown in FIG. 1D, the first side 101a of the substrate 101, specifically the filling material 122c and the auxiliary structure 123, can be subjected to a polishing process, e.g. by a chemical-mechanical planarization (CMP) process. For instance, filling material 122c and material of the auxiliary structure 123 above the first side 101a can be partially or completely removed, e.g. by the CMP process, to an extent that filling material 122c and material of the auxiliary structure 123 is partially removed at the first side 101a of the substrate 101 and left in the recess 120 as shown in FIG. 1E. The CMP process thus removes all filling material 122c and/or auxiliary material above the first side 101a so that a flat surface is formed. The semiconductor material of the semiconductor substrate 101 can thus be exposed at the first side 101a. The filling structure 122 is thus formed by the filling material 122c which remains after the polishing process.

Having the auxiliary structure 123 formed in the recess 120 thus exposed at the first side 101a, the auxiliary structure 123 can be removed from the sidewall 120b and from a portion of the bottom 120a of the recess 120 that is not covered by the filling structure 122 as shown in FIG. 1E. Specifically, the auxiliary structure 123 can be removed from the sidewall 120b and the portion of the bottom 120a of the recess 120 that is not covered by the filling structure 122, for example by anisotropic etching of the auxiliary structure. Optionally, photolithographic techniques can be used to facilitate the etching process. That is, the portion of the auxiliary structure 123 between the filling structure 122 and the bottom 120a can be left, i.e. not removed by the etching process. Accordingly, a cavity 126 can be formed in the recess 120, specifically between the filling structure 122 and the sidewall 120b.

The material of the auxiliary structure 123 is typically selected such that a etch removal selective to the material of the filling structure 122 and the material of the semiconductor substrate 101 is possible. The auxiliary material 123 is formed by a different material than the material of the filling structure 122 and the material of the semiconductor substrate 101.

The cavity 126 is typically laterally bound by the sidewall 120b of the recess 120, which sidewall 120b is exposed by the previous partial removal of the auxiliary structure 123, and an outer surface of the filling structure 122 that face the sidewall 120b of the recess 120 so that the cavity 126 is formed between the filling structure 122 and the sidewall 120b of the recess 120 to laterally space the filling structure 122 from the sidewalls 120b of the recess 120.

Next, as shown in FIG. 1G, the cavity 126 can be filled with carbon 191. Specifically, the carbon 191 can be formed in the recess 120 and optionally on the first side 101a of the substrate 101. The carbon 191 formed on the first side 101a can be can be removed, e.g. by a chemical-mechanical planarization (CMP) process and/or recessed from the first side 101a, forming a flush surface.

FIG. 1H shows depositing of a TEOS (Tetraethyl Orthosilicate) layer 192 on the first side 101a of the substrate 101. A portion of the TEOS layer 192 can be removed by photolithographic techniques, e.g. including photoresist and etching, exposing at least the filling structure 122 and optionally portions of the carbon 191 adjacent to the filling structure 122. However, portions of the carbon 191 at the first side 101a of the semiconductor substrate 101 remain covered by the TEOS layer 192. The TEOS layer 192 merely forms a temporary layer that is removed in a layer process.

Continuing with FIG. 1I, a nitride layer 194 can be deposited on the TEOS layer 192 and the exposed filling structure 122, and the carbon 191 if the carbon 191 has portions which are not covered by the TEOS layer 192. As it is depicted in FIG. 1I, the nitride layer 194 can be formed with a step at a border of the TEOS layer 192 adjacent to the filling structure 122. Since the TEOS layer 192 was at least partially removed from the filling structure 122, the nitride layer 192 is in contact with the filling structure 122.

Further, portion of the nitride layer 194 can be removed by photolithographic techniques, e.g. including photoresist and etching, exposing the portions of the TEOS layer 192 outside of the recess. That is, the exposed portions of the TEOS layer 192 can be arranged in a portion of the substrate 101 that is not recessed. However, the exposed portions can still be close to the recess 120.

Next, as shown in FIG. 1J, the TEOS layer 192 can be removed, e.g., by etching, to form at least one opening 129 between the nitride layer 194 and the first side 101a of the semiconductor substrate 101. The at least one opening 129 can provide an access to the carbon 191 in the recess 120. Specifically, the carbon 191 in the recess 120 can be etched using the at least one opening 129 as an access through which an etching fluid can flow and reach the carbon 191 in the recess 120 to at least partially remove the carbon 191 from the recess 120. The cavity 126, which was previously filled with carbon 191, is now empty again. The carbon 191 was merely temporally filled in the cavity to provide, together with the filling structure 122 and the first side 101a of the semiconductor substrate 101, a closed surface on which the TEOS layer 192 and the nitride layer 192 can be formed.

Finally, as shown in FIG. 1K, the recess 120 having the cavity 126 formed therein can be sealed or closed, e.g. by a closing structure 196. For instance, the recess 120 can be sealed by forming, as closing structure 196, an oxide around the nitride layer 194, or depositing a deposition material, such as a further nitride layer or a metal layer, on the nitride layer 194.

The embodiment illustrated in FIGS. 1A to 1K leaves a portion of the auxiliary structure 122 between the bottom 122a of the filling structure 122 and the bottom 120a of the recess 120 to provide a mechanical support for the filling structure 122, which is additionally fixed at its upper end by the closing structure 196 and or the nitride layer 194.

Figure 2B:
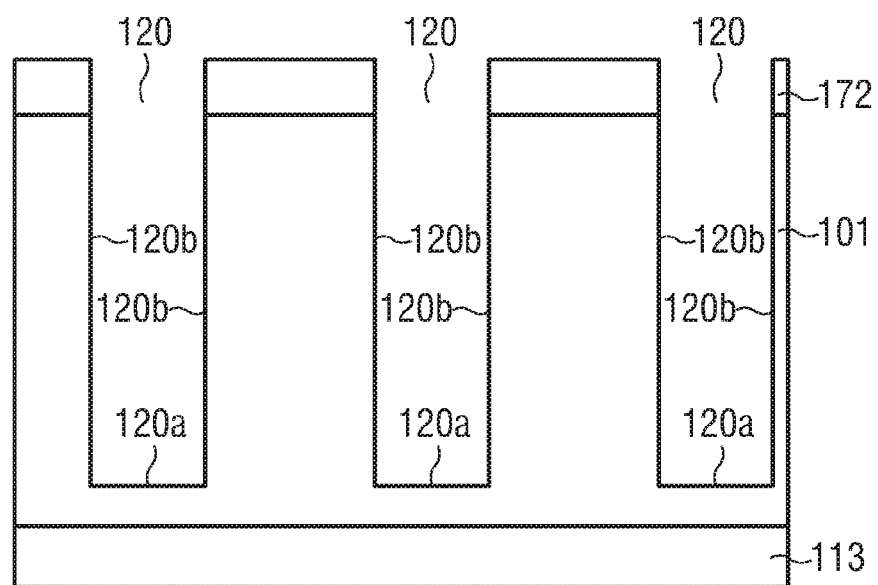
Figure 2E:
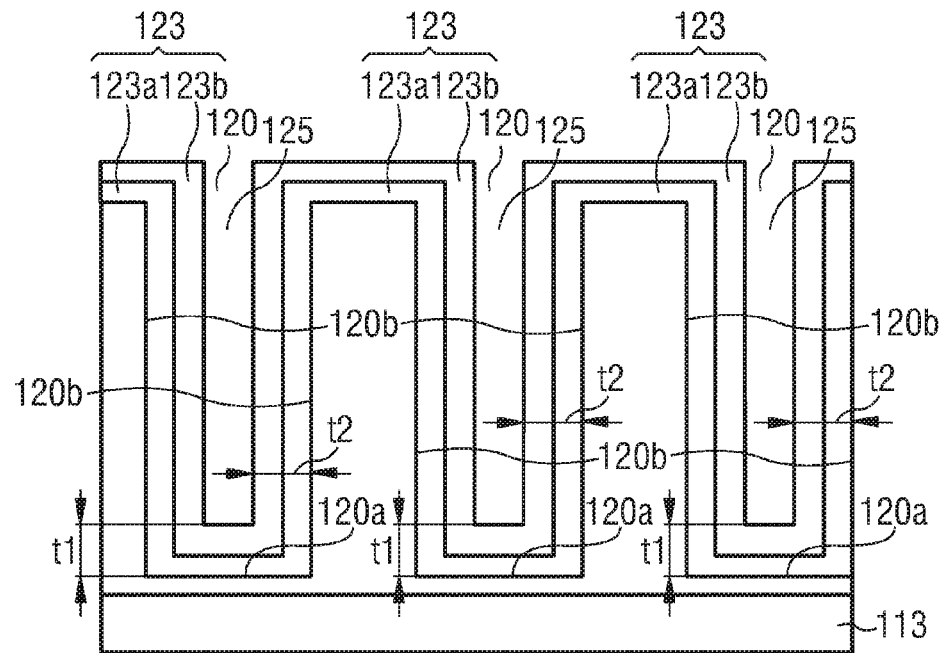
Figure 2F:
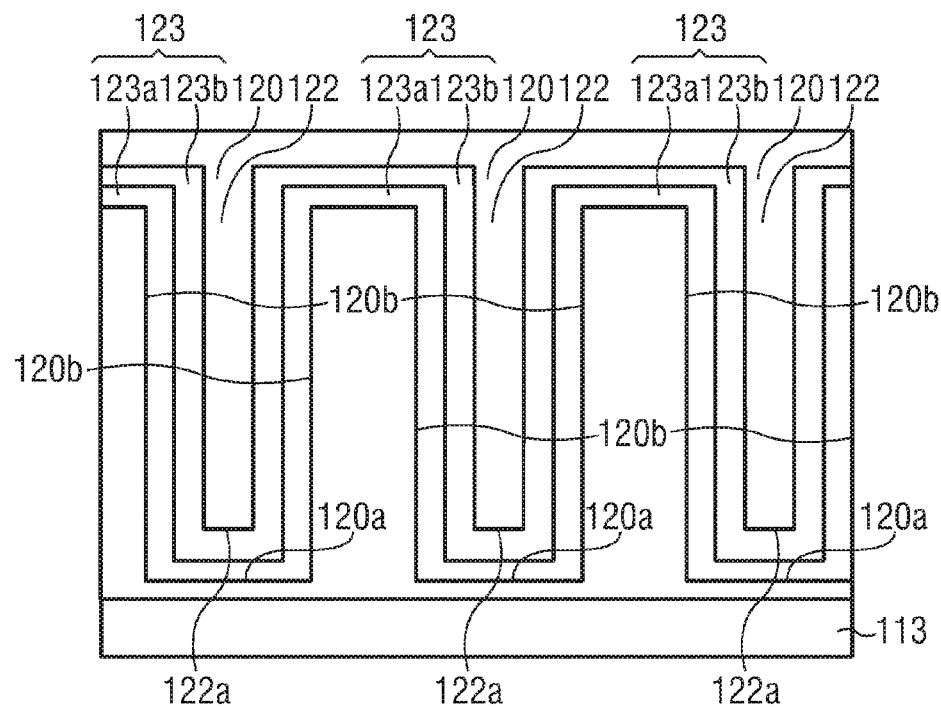
Figure 2I:
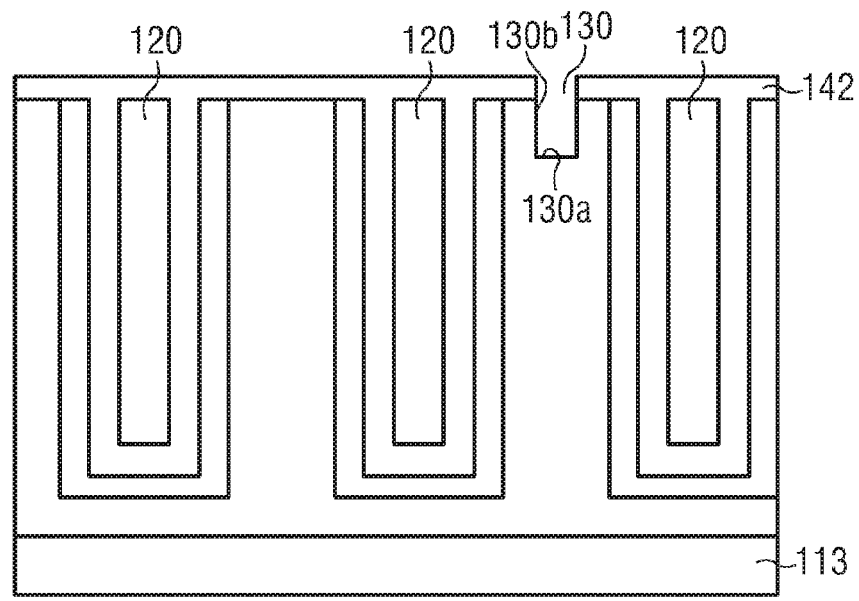
Figure 2J:
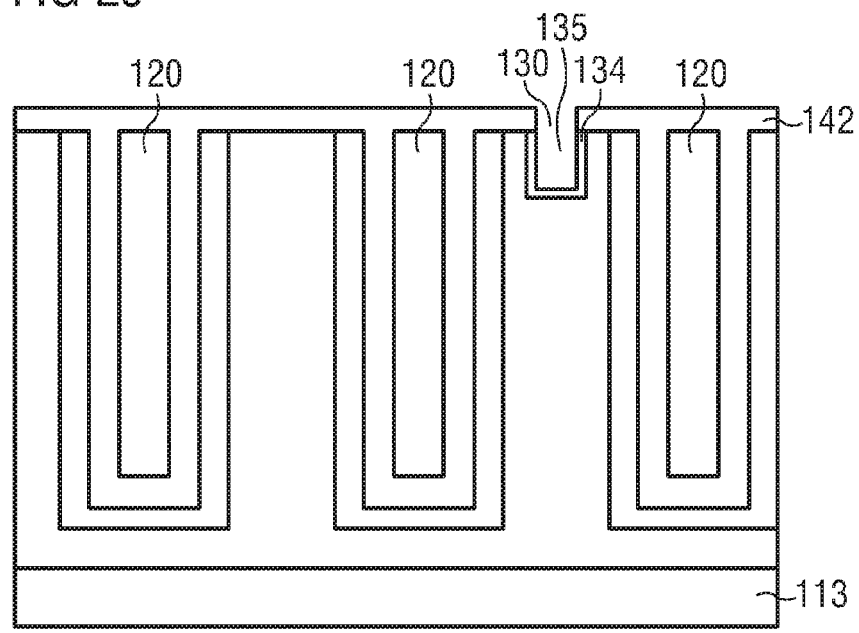
Figure 2Q:
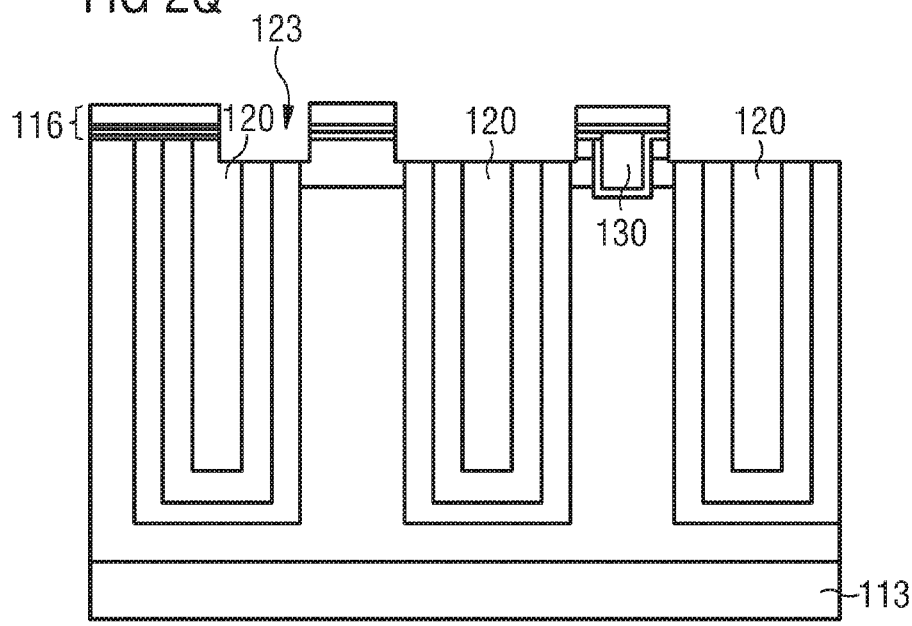
Figure 2R:
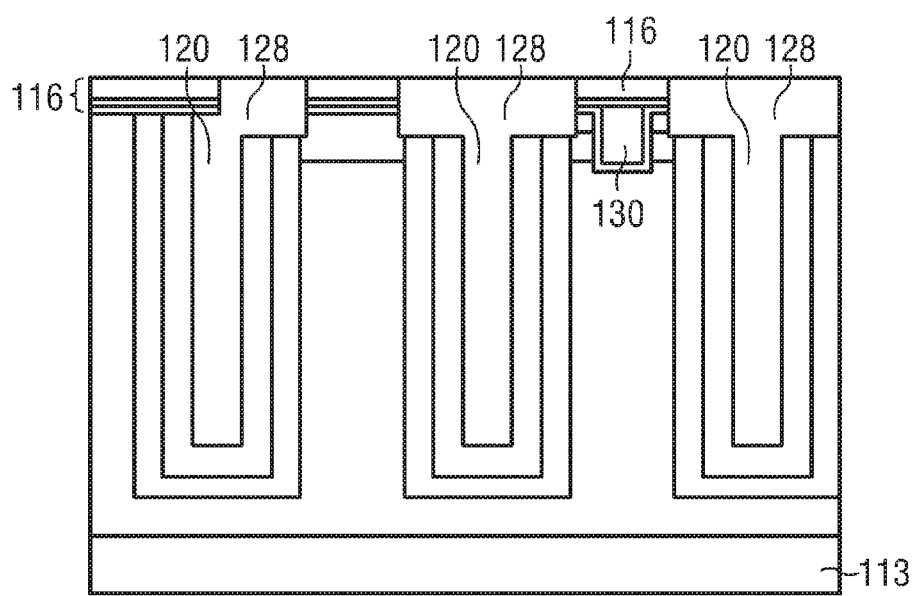

FIGS. 2A to 2R illustrate, in a cross-sectional view of a semiconductor substrate, further processes according to an embodiment. This embodiment differs from the embodiment illustrated in FIGS. 1A to 1K in that the auxiliary structure is completely removed from the recess so that the filling structure is only fixed or attached at its upper end. The bottom or lower end of the filling structure is not fixed by the auxiliary structure in the final device and is a free end of the filling structure.

FIG. 2A shows a semiconductor substrate 101. The substrate 101 can have first side 101a. Further, the substrate 101 can have a second side 101b opposite the first side 101a. According to embodiments, the substrate 101 includes a drift region 112 which can be lightly n-doped. Further, the substrate 101 can include a drain region 113 which can be highly n-doped. Specifically, the drain region 113 can be provided at the second site 101b of the substrate 101. According to an embodiment, the drift region 113 is formed by implantation at a later stage.

For instance, the substrate 101 can be made of any semiconductor material suitable for manufacturing semiconductor components. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC, GaN, materials are used for the substrate 101. Further, the substrate 101 can include an epitaxially grown layer which may form the drift region. Further doping regions such as p-doped body regions forming pn-junctions with the drift region can be integrated into the substrate 101. According to embodiments, the substrate 101 can include Si which is doped by As or P. Specifically, the doping concentration of As or P can be higher in the drain region 113 than in the drift region 112.

Further, a hard mask 172 can be formed on the substrate 101, specifically on the first side 101a of the substrate 101. For instance, the hard mask 172 can be formed by depositing an inorganic material such as an oxide. An example is depositing $SiO_2$ or $Si_3N_4$. A photoresist 173 can be deposited on the deposited inorganic material. A portion of the photoresist 173 can be removed by photolithographic techniques, exposing a portion of the deposited material. Accordingly, the exposed portion of the deposited material can be removed, e.g., by etching, to form the hard mask 172. Thereafter, the photoresist can be removed.

FIG. 2B shows forming of a plurality of recesses 120. Specifically, the plurality of recess 120 can be formed in the drift region of the substrate 101. An exemplary process for forming the plurality of recesses 120 is explained in connection with FIG. 2B. However, the present disclosure is not limited to this specific process. As it will become more clear from the following description, the recesses 120 form field electrode needle trenches 120 in which field electrodes having a column or needle shape are arranged. The field electrodes are finally electrically insulated from the semiconductor substrate 101 by cavities formed around the field electrode in the recesses 120.

For instance, the plurality of recesses 120 can be formed in the exposed regions of the hard mask 172. Specifically, the plurality of recesses 120 can be formed by etching the semiconductor substrate 101 using the hard mask 172 as an etching mask. As shown in FIG. 2C, the hard mask 172 can be subsequently removed.

According to some embodiments, the recesses 120, specifically each of the recesses 120, can have a bottom 120a and a sidewall 120b extending from the bottom 120a to the first side 101a of the substrate 101. The recesses 120, specifically each of the recesses 120, can have a depth of equal to or more than 1 µm, specifically equal to or more than 3 µm, typically equal to or more than 4 µm, and/or equal to or less than 12 µm, specifically equal to or less than 8 µm, typically equal to or less than 6 µm. Further, the recesses 120, specifically each of the recesses 120, can have a smallest lateral dimension of equal to or more than 100 nm, specifically equal to or more than 200 nm, typically equal to or more than 300 nm, and/or equal to or less than 900 nm, specifically equal to or less than 700 nm, typically equal to or less than 500 nm. According to some embodiments, the recesses 120 can be formed to have an aspect ratio of the depth to smallest lateral extension of at least 2:1, particularly of at least 4:1. The geometrical dimensions of the recesses 120, particularly the depth, are typically governed by the rated blocking voltage of the final device. Further, the recesses 120 can have an octagonal shape from a top view. Further, the recesses 120 can have other shapes such as a round shape, etc.

According to embodiments, an auxiliary structure 123 can be formed on the sidewall 120b and/or the bottom 120a of each of the recesses 120. As shown in FIG. 2D, the auxiliary structure 123 can include a first auxiliary layer 123a. The first auxiliary layer 123a can be formed by forming a first auxiliary material on the sidewall 120b and/or bottom 120a of the respective recesses 120. According to embodiments, the first auxiliary layer 123a can be a first insulating layer 123a and formed by using a first insulating material. For instance, the first auxiliary layer 123a can be formed by thermal oxidation. Specifically, the oxide layer is formed by thermal oxidation, e.g. to a thickness have a thickness of equal to or more than 30 nm, specifically equal to or more than 60 nm, typically equal to or more than 150 nm, and/or equal to or less than 700 nm, specifically equal to or less than 500 nm, typically equal to or less than 300 nm.

As shown in FIG. 2E, the auxiliary structure 123 can further include a second auxiliary material on the first auxiliary layer 123a to form a second auxiliary layer 123b on the first auxiliary layer 123a. Typically, the second auxiliary layer 123b completely covers the first auxiliary layer 123a. According to embodiments, the second auxiliary layer 123a can be a second insulating layer 123a and formed by using a second insulating material. The first and second insulating materials can be the same material or can be of different materials.

The second auxiliary material can be deposited on the first auxiliary layer 123a. For instance, the second auxiliary layer 123b can be formed by CVD (chemical vapour deposition), HDP CVD (high-density plasma chemical vapour deposition), TEOS (Tetraethyl Orthosilicate) deposition, and/or PSG (phosphosilicate glass) deposition. The second auxiliary layer 123b can have a thickness of equal to or more than 30 nm, specifically equal to or more than 60 nm, typically equal to or more than 150 nm, and/or equal to or less than 700 nm, specifically equal to or less than 500 nm, typically equal to or less than 300 nm. According to some embodiments, the thickness of the first auxiliary layer 123a can be smaller than the thickness of the second auxiliary layer 123b.

According to some embodiments, the auxiliary structure 123 can be formed such to keep a hollow space 125 within the recesses 120, specifically within each of the recesses 120. Further, the auxiliary structure 123 can be formed to have a first thickness t1 at the bottom 120a of the recesses 120 and a second thickness t2 at the sidewall 120b. The first thickness t1 can be equal to the second thickness t2. According to some embodiments, the first thickness t1 is at least 2-time, particularly at least 3-times, larger than the second thickness t2. The thicknesses t1 and t2 are illustrated in FIG. 2E.

As shown in FIG. 2F, the hollow space 125 of the respective recess 120 can be filled with a filling material 122c, specifically for forming a respective filling structure 122 in the recesses 120. The filling structures 122, specifically each of the filling structures 122, can have a lower end 122a opposite, and specifically spaced from, the bottom 120a of the respective recess 120. The filling structures 122 can be formed, e.g., by depositing the filling material 122c on the first side 101a of the substrate 101 to fill the recesses 120. According to embodiments, the filling material 122c can be an electrically conductive material for forming respective electrically conducting structures 122 in the recesses 120.

As shown in FIG. 2G, the first side 101a of the substrate 101, specifically the filling material 122c and the auxiliary structure 123, can be polished, e.g. by a chemical-mechanical planarization (CMP) process. For instance, filling material 122c and the material of the auxiliary structure 123 above the first side 101a can be partially or completely removed, e.g. by the CMP process, to an extent that filling material 122c and material of the auxiliary structure 123 is partially or completely removed at and from the first side 101a of the substrate 101 but left in the recesses 120. The CMP process thus removes all filling material 122c and/or auxiliary material above the first side 101a so that a flat surface is formed. The semiconductor material of the semiconductor substrate 101 can thus be exposed at the first side 101a.

The filling structures 122 may form field electrodes arranged in the recesses 120, or needle trenches, in the final device. The filling material 122c, specifically the electrically conductive material, can be a highly doped, e.g. n-type, polycrystalline semiconductor material, such as poly-Si, a metal stack, such as TiN and W, and/or combinations thereof.

As shown in FIG. 2H, a trench hard mask 142 can be deposited on the substrate 101, specifically on the exposed first side 101a of the substrate 101. A photoresist 143 can be deposited on the trench hard mask 142. A portion of the photoresist 143 can be removed by photolithographic techniques, exposing portions of the trench hard mask 142. Accordingly, the exposed portions of the trench hard mask 142 can be removed, e.g., by etching. As shown in FIG. 2I, at least one trench, typically a plurality of trenches 130, can be formed, specifically, using the trench hard mask 142 as an etching mask. Thereafter, the photoresist can be removed.

According to embodiments, the at least one trench 130, specifically each of the plurality of trenches 130, can have a bottom 130a and sidewalls 130b extending from the bottom 130a to the first side 101a of the semiconductor substrate 101. Further, the at least one trench 130, specifically each of the plurality of trenches 130, can have a depth of equal to or more than 0.3 µm, specifically equal to or more than 0.5 µm, typically equal to or more than 0.7 µm, and/or equal to or less than 1.5 µm, specifically equal to or less than 1.2 µm, typically equal to or less than 0.9 µm. Specifically, the depth of the trenches 130 can be less than the depth of the recesses 120.

After forming the plurality of trenches 130, the trench hard mask 142 can be removed. The plurality of trenches 130 can be checked for proper formation. For instance, measurements can be performed for determining the depth of the trenches.

As shown in FIG. 2J, a gate dielectric 134 can be formed on the sidewalls 130b and the bottom 130a of the trenches 130. For forming the gate dielectric 134, a gate dielectric material can be deposited on the substrate 101, specifically on the first side 101a of the substrate 101a, on the trench hard mask 142 if not removed before, and/or in the trenches 130. Thereafter, the gate dielectric material can be removed from the first side 101a of the substrate 101, specifically in an area outside of the trenches 130, to a desired thickness, which can be zero or larger. The gate dielectric 134 can be formed to a thickness of equal to or more than 30 nm, specifically equal to or more than 40 nm, typically equal to or more than 50 nm, and/or equal to or less than 80 nm, specifically equal to or less than 70 nm, typically equal to or less than 60 nm. The gate dielectric material of the gate dielectric 134 can be an insulating material, such as an oxide. For instance, the gate dielectric 134 can include SiO2, the second auxiliary material of the second auxiliary layer 123b, and/or combinations thereof. The gate dielectric 134 can also be formed by thermal oxidation.

Optionally, before forming the gate dielectric 134, a sacrificial oxide can be formed on the substrate 101, specifically on the first side 101a of the substrate 101, e.g. by thermal oxidation and subsequently removed.

Continuing with FIG. 2K, a gate electrode 132 can be formed on the gate dielectric 132 in the trenches 130. The gate electrode 132 can be formed, e.g., by depositing gate electrode material being electrically conductive on the first side 101a of the substrate 101, filling the trenches 130. The gate electrode material can be removed from the first side 101a of the substrate 101, e.g. by a chemical-mechanical planarization (CMP) process, leaving gate electrode material in the trenches. The gate electrode 132 can be formed to a thickness of equal to or more than 300 nm, specifically equal to or more than 400 nm, typically equal to or more than 500 nm, and/or equal to or less than 800 nm, specifically equal to or less than 700 nm, typically equal to or less than 600 nm. The gate electrode material can be semiconductor material, such as poly-Si, a metal stack, such as TiN and W, the same material as the filling structures 122, and/or combinations thereof.

Specifically, the gate dielectric 132 and the gate electrode 134 can fill the gate trenches 130. According to an embodiment, the gate dielectric 132 insulates the gate electrode 134 from the substrate 101. That is, the gate dielectric 132 can be disposed between the sidewalls 130b and the bottom 130a of the trenches 130 and the gate electrode 132.

According to an embodiment, the trenches 130 can be laterally spaced from the recesses 120. Further, the trenches 130 can be formed to have a smallest lateral dimension which is less than a smallest lateral dimension of the recesses 120. Furthermore, the trenches 130 can be formed to have a largest lateral dimension which is less than a smallest lateral dimension of the recesses 120. In this context, a "lateral dimension" can be a dimension parallel to a plane of the first side 101a of the substrate 101.

As shown in FIG. 2L, an insulating layer 121 can be formed on the substrate 101, specifically on the first side of the substrate 101a. For instance, the insulating layer 121 can be sputtered on the substrate 101, specifically on the first side of the substrate 101a. The insulating layer 121 can be a nitride layer, which can be formed on an optional thin pad oxide layer.

Continuing with FIG. 2M, at least one or more doping regions 114 can be formed in the semiconductor substrate 101. For instance, a plurality of doping regions 114 can be formed. Specifically, the doping regions 114 can be respectively formed between the trenches 130 and the recesses 120 and/or, if more than one recess 12 is formed, between the pluralities of recesses 120, where there is no trench 130 formed between adjacent recesses 120.

The doping region 114 can include a body region 114a. Specifically, a dopant can be implanted into the drift region to form a doping region 114a having a conductivity type opposite to the conductivity type of the drift region. For instance, when the substrate 101 is an n-type semiconductor, the doping region 114a can be doped with a p-type dopant, and vice versa. Doping of the doping region 114a can lead to a change of a semiconductor conductivity type, e.g. from n-type to p-type, and vice versa. For forming the body region 114a, a patterning process by lithographic methods including a photoresist and pattering the photoresist can be performed. After implantation, the photoresist can be removed and/or a thermal treatment can be performed (Body Drive).

Further, the doping regions 114 can include a source region 114b. The source region 114b can be formed in at least some regions in which the body regions 114a were formed. For instance, the source region 114b can be respectively formed between the trenches 130 and the recesses 120 and/or, if more than one recess 12 is formed, not between the plurality of recesses 120, where there is no trench 130 formed between adjacent recesses 120. For forming the source region 114b, a further patterning process by lithographic methods including a photoresist and pattering the photoresist can be performed. According to embodiments, the absolute dopant concentration of the source region 114b can be higher than the dopant concentration in the body region 114a. Thereafter, the photoresist can be removed and/or a thermal treatment can be performed (Source Drive). A common thermal treatment for the body region 114a and the source region 114b can also be carried out.

FIG. 2M shows exemplarily body implantation and source implantation. Typically, first p-dopants are implanted to form body regions 114a followed by implantation of n-dopants to form source regions 114b embedded into the body regions 114a.

As shown in FIG. 2N, the insulating layer 121 can be patterned by lithographic methods including a photoresist. Specifically, the insulating layer 121 can be partially removed from the substrate, specifically the first side 101a of the substrate 101, in an area corresponding to an inner part of the substrate 101a in which the trenches 130 and/or the recesses 120 are formed. Further, the insulating layer 121 can be left on the substrate, specifically on the first side 101a of the substrate 101, in an area corresponding to an outermost recess 120, i.e. the recess 120 that is closest to the edge of the substrate 101. Specifically, the insulating layer can be partially removed from and partially left on the outermost recess 120 in light of edge termination.

As shown in FIG. 2O, an insulating layer 116 or insulating stack 116 can be formed on the first side 101a of the first substrate 101. Specifically, the insulating stack 116 can include one or more insulating layers that can be deposited one after another. For instance, the insulating layer 116 can include a first layer, e.g., of thermal oxide, a second layer, e.g. of an oxide nitride, and a third layer, e.g. of BPSG. The first layer can be formed or deposited to a thickness of equal to or more than 10 nm and/or equal to or less than 60 nm, typically equal to about 30 nm. The second layer can be formed or deposited to a thickness of equal to or more than 10 nm and/or equal to or less than 60 nm, typically equal to about 30 nm. The third layer can be formed or deposited to a thickness of equal to or more than 50 nm and/or equal to or less than 500 nm, typically equal to about 200 nm.

Continuing with FIG. 2P, the insulating stack 116 can be patterned by lithographic methods to at least partially expose the filling structures 122 and/or respective regions between the trenches 130 and the 120. Specifically, the regions to be exposed between the trenches 130 and the recesses 120 can be such that at least a region of the doping region can be exposed. For instance, the regions to be exposed between the trenches 130 and the recesses 120 can be in the form of a ring surrounding the filling structures 122. For instance, a photoresist 145 can be applied and patterned so that regions of the photoresist 145 corresponding to the regions to be exposed are removed. Further, the insulating stack 116 can be left on remaining portion of the insulating layer 121. The insulating stack 116 can be etched in the regions where the photoresist 145 is removed, specifically down to the filling structures 122 and/or the first side 101a of the substrate 101, respectively. In that context, the filling structures 122 and/or the substrate 101 can provide an etch stop. When etching the insulating stack 116, the thus exposed portions of the auxiliary structure 123 can be slightly etched. When practicing embodiments, the auxiliary structures 123 can be etched in an upper region thereof to ensure that all material of the insulating stack 113 is removed from the exposed regions of the substrate 101, specifically the first side 101a of the substrate (overetching). After etching of the insulating stack 116, the photoresist 145 can be removed as shown in FIG. 2Q.

Using the etched regions of the insulating stack 116 as a pattern, the filling structures 122 and the substrate 101 can be etched in the exposed regions. For instance, an etching method can be used that provides an anisotropic etch. Specifically, doping region 114a, 114b of the substrate 101 can be etched from the first side 101a down through the source region 114b to expose the body region 114a. Further, a part of the body region 114a can be removed. Thereafter, depth & CD measurements can be performed.

Having regions of the body region 114a exposed and/or partially etched, a body contact implantation can be performed to increase the p-type dopants in a contact area for the source metallization 114 to be formed. Thereafter, an annealing process can be performed. When practicing embodiments, a contact resistance between the doping region and the source metallization can be formed.

FIG. 2R shows closing or sealing of the recesses 120. According to some embodiments, the at least one recess 122 can be closed, completely or partially, by at least one plug 128 formed in an upper portion of the respective recess 120. The at least one plug can cover the auxiliary structure at least on the sidewall 120b of the at least one recess 120. The upper portion of the filling structures 122 may by defined by an upper end of the insulating stack 116. For instance, the plug 128 can be formed by depositing a plug material. The plug material can be a highly doped, e.g. n-type, polycrystalline semiconductor material, such as poly-Si, a metal stack, such as TiN and W, and/or combinations thereof. Thereafter, the first side 101a of the substrate 101, specifically the plug material deposited above the upper end of the insulating stack 116 and/or on the insulating stack 116, can be removed, e.g. by a chemical-mechanical planarization (CMP) process.

According to an embodiment, the plug 128 is in contact with the filling structure 122 to provide mechanical support for the filling structure 122 during a later etching process. The plug 128 is typically also in contact with the semiconductor substrate 101 or structures formed on the semiconductor substrate 101 so that the plug 128 is anchored with the semiconductor substrate 101.

According to embodiments, a plurality of plugs 128 can be formed in the recesses 120. Specifically, a plug 128, specifically separate plugs 128, can be formed in each of the recesses 120 if more than one recess 120 is formed. According to embodiments, the at least one plug 128 can be formed of an electrically conductive material which is in contact with the filling material 122c, specifically with the respective one of the filling structures 122.

Figure 3A:
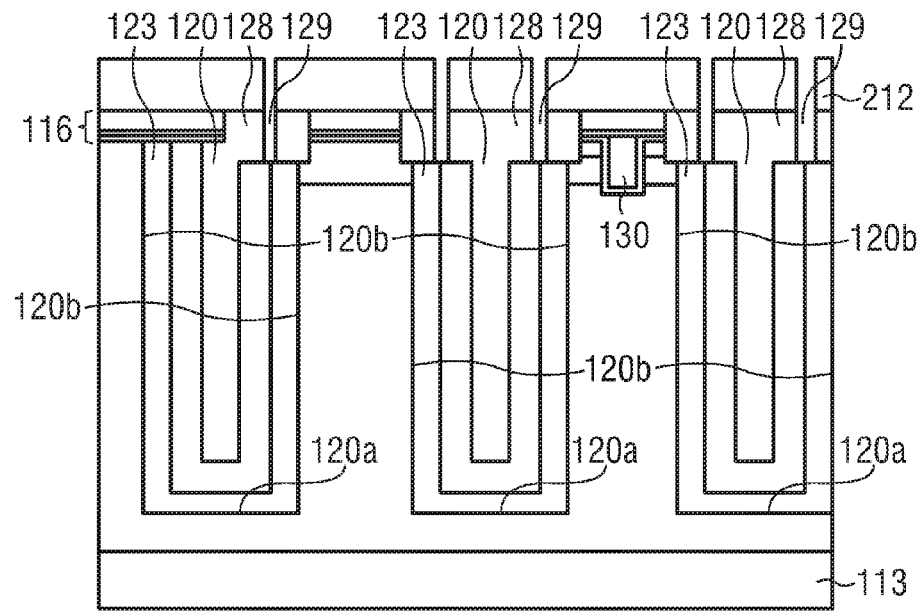
FIGS. 3A to 3C illustrate, in a cross-sectional view of a semiconductor substrate, further processes according to an embodiment.
Figure 3B:
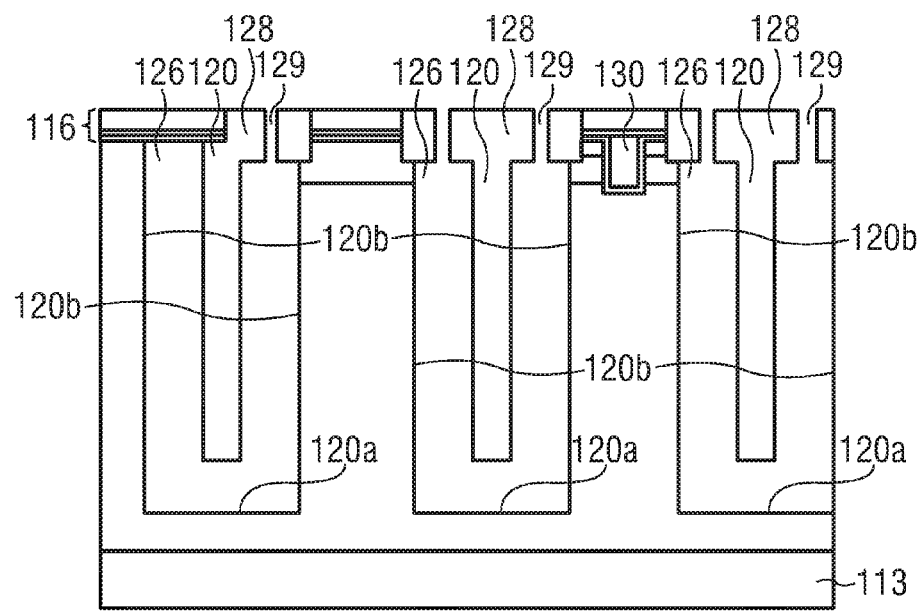
Figure 3C:
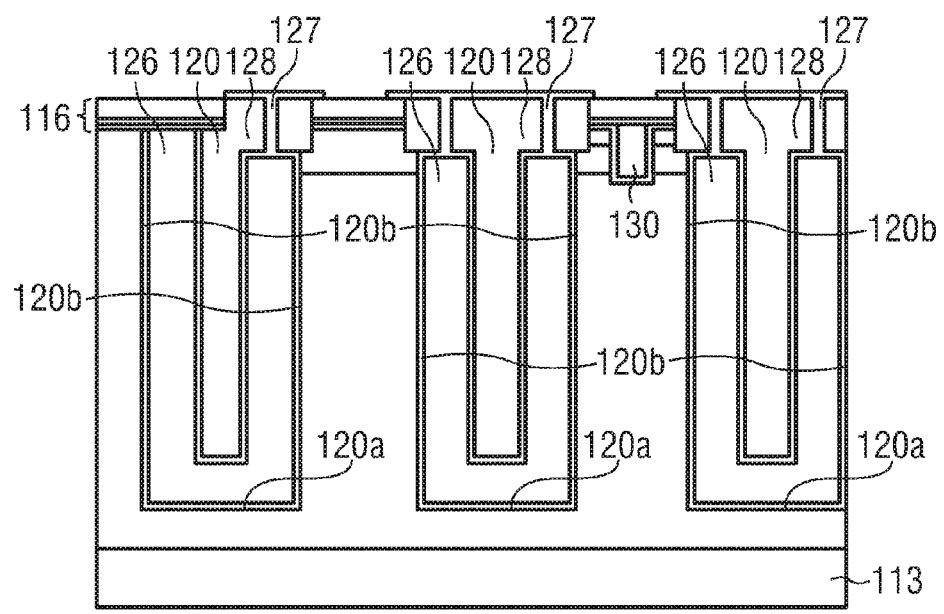
Figure 4:
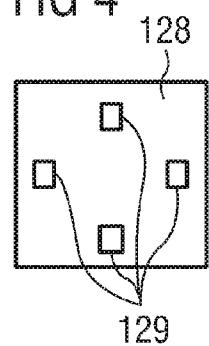
FIG. 4 illustrates the processes of FIG. 3A in a top view onto the semiconductor substrate.

FIGS. 3A to 3C show, in a cross-sectional view of the substrate 101, forming of at least one opening 129 in the at least one plug 128, at least removing the auxiliary structure 123 for forming a cavity in the at least one recess 120, and closing the at least one opening 129 in the at least one plug by, for example, thermal oxidation, while FIG. 4 shows the at least one opening 129 in the at least one plug from top view on the at least one plug.

As shown in FIG. 3A, a photoresist 212 can be deposited on the substrate 101, specifically the first side 101a of the substrate 101. A portion of the photoresist 212 can be removed by photolithographic techniques, exposing a portion of the at least one plug 128. For instance, the material of the at least one plug 128 can be anisotropically etched, specifically in the case when the plug material is polycrystalline semiconductor material. Accordingly, the exposed portion of the at least one plug can be removed, e.g., by etching, to form at least one opening 129 in the at least one plug 128. The at least one opening 129 can partially expose the auxiliary structure 129, specifically an upper portion of the auxiliary structure 129. That is, the at least one opening can be formed in a region of the at least one plug 129 that covers the auxiliary structure 123, i.e. that does not cover the filling material 122c. Thereafter, the photoresist can be removed.

FIG. 4 shows an exemplary arrangement of the at least one opening 129. Specifically, shows a plurality of opening 129. That is, more than one opening 129 can be formed in the at least one plug and/or, when a plurality of plugs 128 is formed, in each of the plugs 128. FIG. 4 shows exemplary four openings 129 that are arranged around the area covering the filling material 122c. However, any desired number of openings 129 can be formed in the plugs 128, e.g. one, two, three, four, five, six etc.

Continuing with FIG. 3B, the auxiliary structure 123 can be at least partially removed from the sidewall 120b of the recesses 120 and/or the bottom 120a of the recesses 120. Specifically, the auxiliary structure 123 in the recesses 120 can be at least partially removed by using the at least one opening 129 as an access to the auxiliary structure 123 in the recesses 120. For instance, the auxiliary structure 123 in the recesses 120 can be etched using the openings 129 as an access through which the etching fluid can flow and reach the auxiliary structure 123 in the recesses 120 to at least partially remove the auxiliary structure 123 in the recesses 120.

By at least partially removing the auxiliary structure 123, e.g. at least partially from the sidewall 120b and/or the bottom 120a of the respective recesses 120, cavities 126 can be formed in the recesses 120, specifically between the auxiliary structures 123 and the sidewall 120*b* of the recesses 120. Typically, one cavity 126 can be formed in each recess 120. However, more than one cavity 126 can be formed in each recess 120 as well. Specifically, the present disclosure provides recesses including a cavity.

As shown in FIG. 3C, the at least one opening 129 in the at least one plug 128 can be closed or sealed. For instance, the at least one opening 129 in the at least one plug 128 can be closed or sealed by thermally oxidizing the at least one plug 128. Parts of semiconductor material that are not covered by the insulating stack 116 and/or the auxiliary structure 123 are subjected to the oxidation and are consumed. Thus, an auxiliary plug 127 is formed by partially consuming the plug material surrounding the at least one opening 129. According to embodiments, the at least one plug 128 and the at least one auxiliary plug 127 forming together at least one plug for completely closing the cavity.

Thermal oxidation grows an oxide on the first side 101*a* of the substrate 101 if it is not covered by the insulating stack 116 and partially in the recesses 120. In particular, the thermal oxide partially consumes and thus grows on the filling material 122*c*, specifically the filling structures 122, and on the sidewall 120*b* of the recesses 120. In particular, a thermal oxide can grow on the exposed portions of the filling material 122*c*, specifically the filling structures 122, the sidewall 120*b* of the recesses 120 and/or the bottom 120*a* of the recesses 120. Further, the growth rate of the thermal oxide forming the auxiliary plug 127 can be higher on the filling material 122*c* and/or the plug 128 than on the substrate 101. For instance, the growth rate of the auxiliary plug 127 can be about two times to about four times higher on the filling structures 122 than on the substrate 101.

When practicing embodiments, a gas, specifically a processing gas, such as oxygen ($O_2$), water vapour ($H_2O$), nitrogen ($N_2$), argon (Ar) and/or combinations thereof, can be sealed in the cavities 126. During thermal oxidation, the oxide ($O_2$) and/or water vapour ($H_2O$) in the gas sealed in the cavities 126 is consumed leading to a reduced vapour pressure or vacuum level in the cavities 126 than in surrounding areas, such as above the first side 101*a* of the substrate 101.

FIGS. 5A to 5I show, in a cross-sectional view of the substrate 101, an alternative way of forming of at least one opening in the at least one plug for forming a cavity in the at least one recess, and closing the at least one opening. In particular, FIGS. 5A to 5I show sealing of the at least one opening 129 in the plug 128 by BPSG reflow. The exemplary arrangement of the at least one opening 129, specifically of the plurality of openings 129, shown in FIG. 4 can also apply to this alternative way.

Figure 5A:
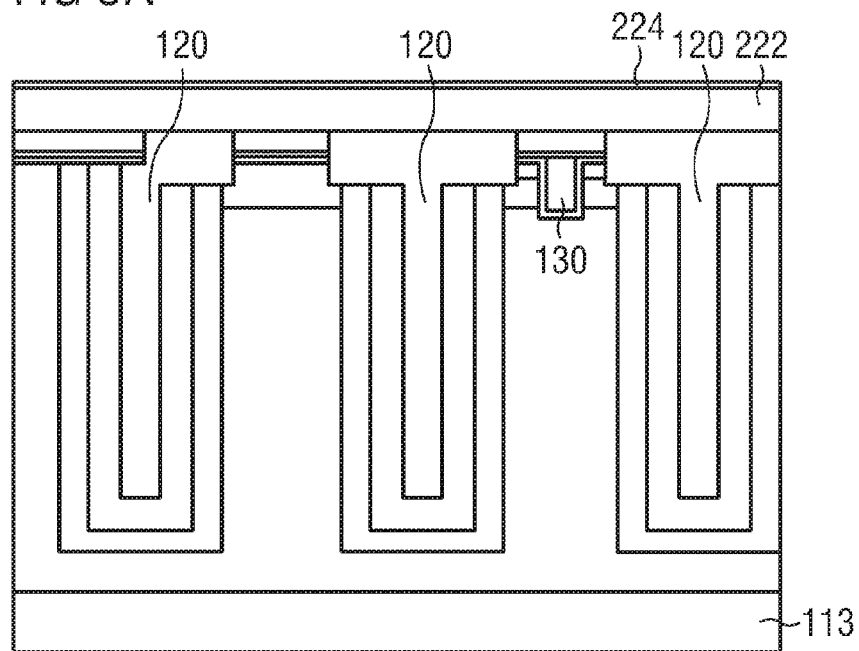

As shown in FIG. 5A, a BPSG (borophosphosilicate glass) layer 222 can be formed on the substrate 101, specifically on the first side 101*a* of the substrate 101. For instance, the BPSG layer 222 can be deposited on the substrate 101, specifically on the first side 101*a* of the substrate 101. The BPSG layer 222 can have a thickness of of equal to or more than 50 nm, specifically equal to or more than 150 nm, typically equal to or more than 300 nm, and/or equal to or less than 1000 nm, specifically equal to or less than 700 nm, typically equal to or less than 500 nm.

Further, a nitride layer 224 can be deposited on the BPSG layer 222. The nitride layer 224 can have a thickness of of equal to or more than 15 nm, specifically equal to or more than 30 nm, typically equal to or more than 45 nm, and/or equal to or less than 100 nm, specifically equal to or less than 80 nm, typically equal to or less than 60 nm.

Figure 5B:
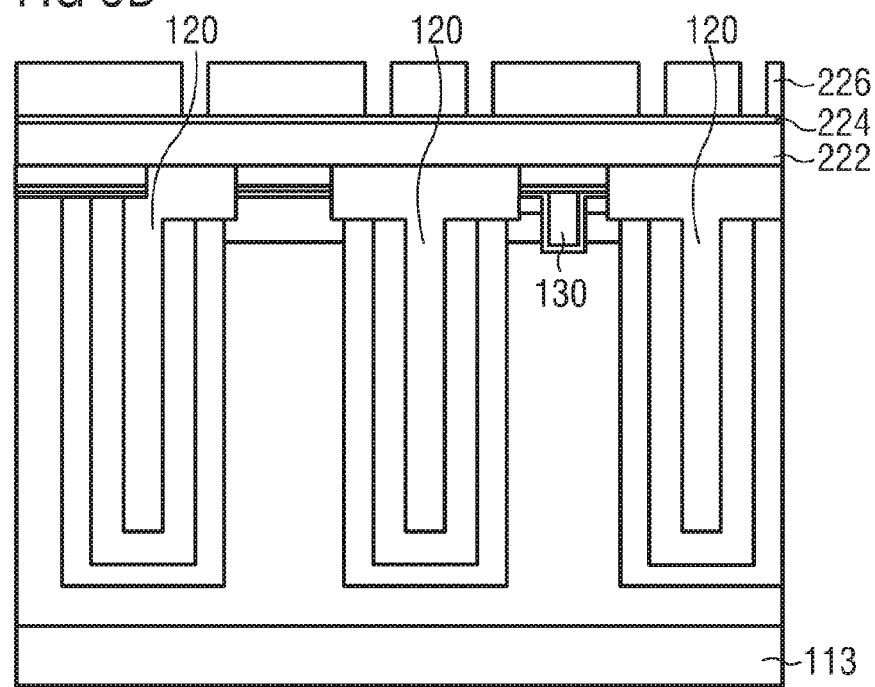

Continuing with FIG. 5B, a photoresist 226 can be deposited on the nitride layer 224. A portion of the photoresist 226 can be removed by photolithographic techniques, exposing a portion of the nitride layer 224. Accordingly, the exposed portions of the nitride layer 224 and the BPSG layer 222 can be removed, e.g., by etching, specifically anisotropic etching, as shown in FIG. 5C, partially exposing the at least one plug 128. Thereafter, the photoresist can be removed.

As shown in FIG. 5D, a further nitride layer 228 can be deposited on the nitride layer 224. Although the further nitride layer 228 can be deposited on the whole substrate, specifically the first side 101*a* of the substrate, the further nitride layer 228 can be provided to cover portions of the semiconductor device 100, specifically at the first side 101*a* of the substrate 101, that are not covered by the nitride layer 224, such as the just exposed portions. Specifically, the further nitride layer can cover the exposed portions of the at least one plug 128 and/or on sidewalls of the structures etched into the BPSG layer 222.

Figure 5E:
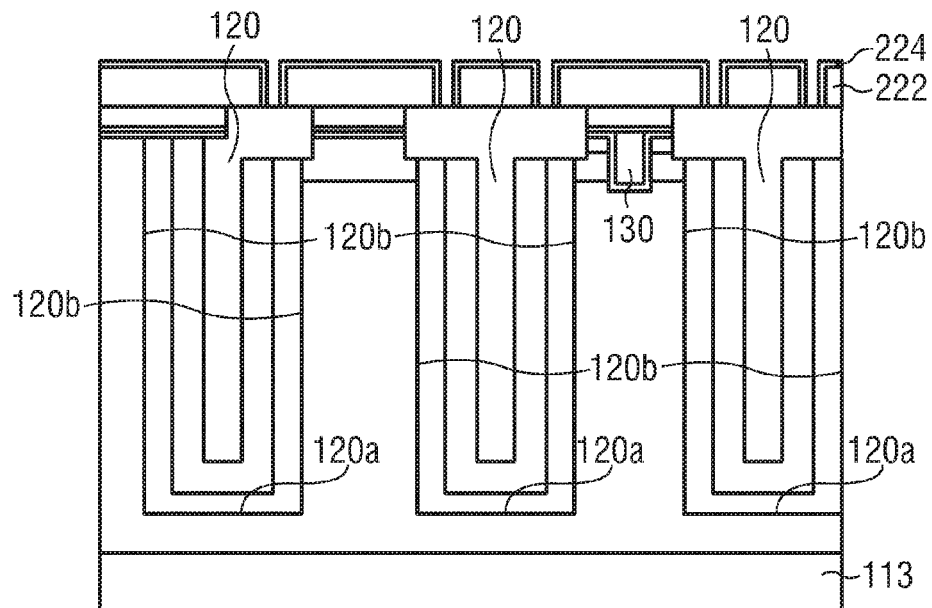

Next, as shown in FIG. 5E, the further nitride layer 228 can be removed from the at least one plug, e.g. by etching, exposing portions of the at least one plug 128 that have been exposed in FIG. 5C. That is, the portions of the further nitride layer covering the exposed portions of the at least one plug can be removed. As can be seen from FIG. 5E, the exposed portion of the at least one plug 129 in FIG. 5E can be smaller than the exposed portion of the at least one plug 128 in FIG. 5C. This variation may correspond to the thickness of the further nitride layer 228 on the sidewalls of the structures etched into the BPSG layer 222.

Figure 5F:
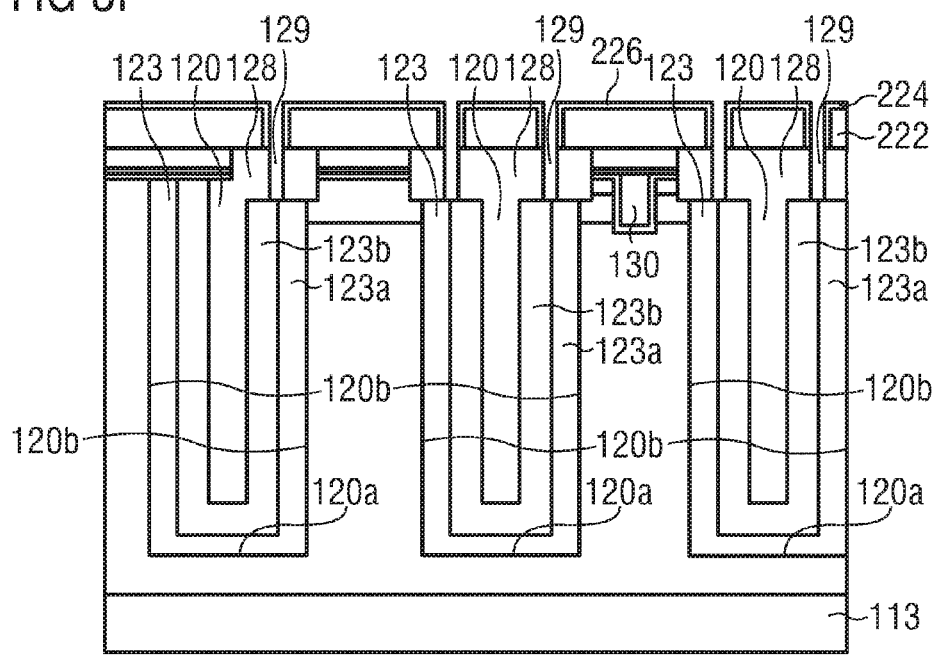

Continuing with FIG. 5F, the exposed portions of the at least one plug 129 can be removed. For instance, the material of the at least one plug 128 can be anisotropically etched, specifically in the case when the plug material is polycrystalline semiconductor material. Accordingly, the exposed portion of the at least one plug can be removed, e.g., by etching, to form at least one opening 129 in the at least one plug 128. Whereas portions covered by the nitride layer 224 and/or the further nitride layer 228 can be protected from being removed. That is, the nitride layer 224 and/or the further nitride layer 228 can function as an etch stop layer with respect to the etching process of the at least one plug 129.

The at least one opening 129 can partially expose the auxiliary structure 129, specifically an upper portion of the auxiliary structure 129. That is, the at least one opening can be formed in a region of the at least one plug 129 that covers the auxiliary structure 123, i.e. that does not cover the filling material 122*c*.

As shown in FIG. 5G, the auxiliary structure 123 can be at least partially removed from the sidewall 120*b* of the recesses 120 and/or the bottom 120*a* of the recesses 120. Specifically, the auxiliary structure 123 in the recesses 120 can be at least partially removed by using the at least one opening 129 as an access to the auxiliary structure 123 in the recesses 120. For instance, the auxiliary structure 123 in the recesses 120 can be etched using the openings 129 as an access through which the etching fluid can flow and reach the auxiliary structure 123 in the recesses 120 to at least partially remove the auxiliary structure 123 in the recesses 120.

By at least partially removing the auxiliary structure 123, e.g. at least partially from the sidewall 120*b* and/or the bottom 120*a* of the respective recesses 120, cavities 126 can be formed in the recesses 120, specifically between the auxiliary structures 123 and the sidewall 120*b* of the recesses 120. Typically, one cavity 126 can be formed in each recess 120. However, more than one cavity 126 can be formed in each recess 120 as well. Specifically, the present disclosure provides recesses including a cavity.

As shown in FIG. 5H, the nitride layer 224 and/or the further nitride layer 228 can be removed. Next, as shown in FIG. 5I, the at least one opening 129 can be sealed by BPSG a reflow process of the BPSG layer 222. Specifically, the BPSG layer 222 can be subjected to a temperature of equal to or greater than 800° C. and/or equal to or smaller than 1100° C., typically to a temperature of about 950° C. The BPSG layer 222 can be subjected to the temperature for a time of equal to or greater than 20 min and/or equal to or smaller than 60 min, typically for at time of about 40 min. The reflow process can be performed, without being limited thereto, in a gas and atmosphere of N2, O2, SF6, Ar, under high pressure, normal pressure, or vacuum conditions.

Figure 6A:
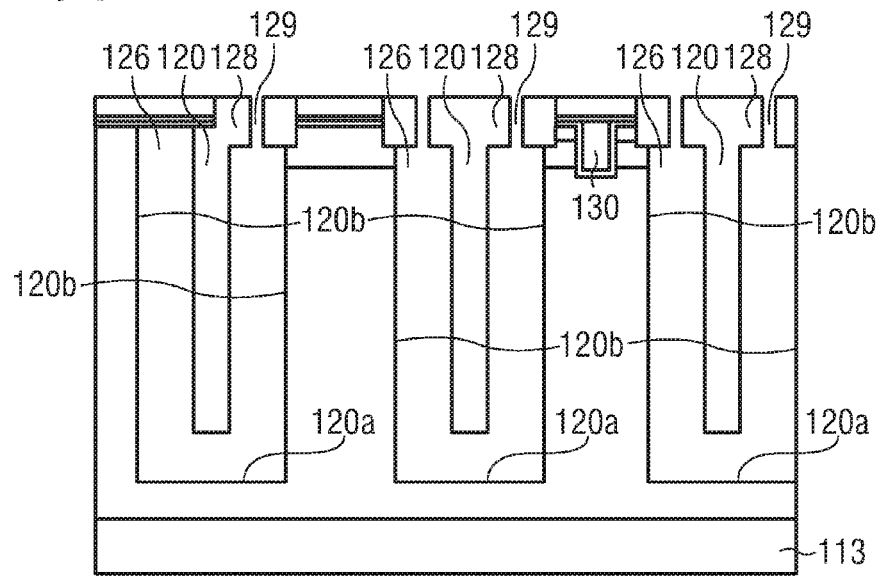
FIGS. 6A and 6B illustrate, in a cross-sectional view of a semiconductor substrate, further processes according to an embodiment.
Figure 6B:
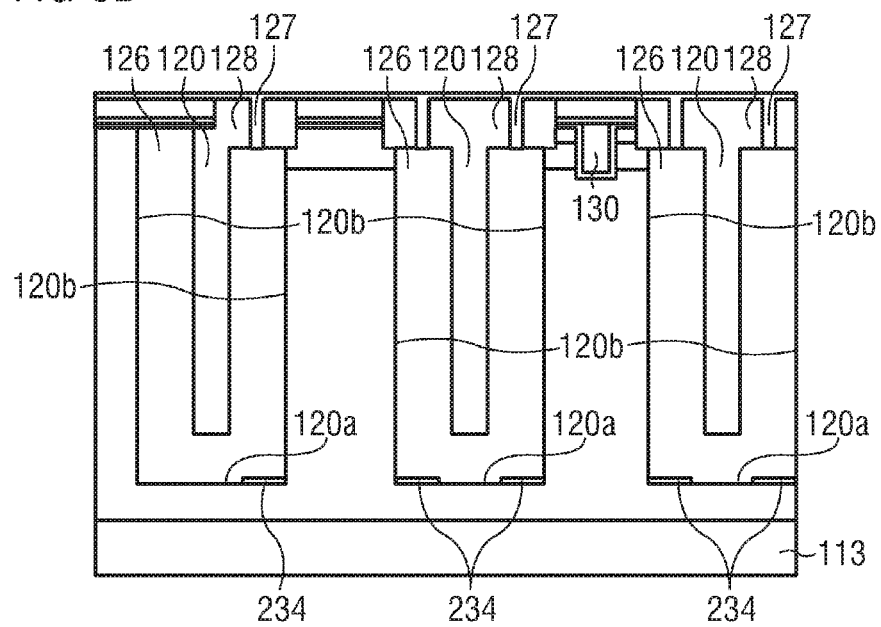

FIGS. 6A and 6B show, in a cross-sectional view of the substrate 101, an alternative way of closing the at least one opening by depositing a material that closes the opening 129 in the plug 128. In particular, FIGS. 6A and 6B show sealing of the at least one opening 129 of the plug 128, which can follow the forming of the at least one opening 129 and the cavity 126 according to FIGS. 3A and 3B. That is the processes according to FIGS. 3A and 3B can be performed before the closing of the at least one opening 129 according to FIGS. 6A and 6B is performed. The exemplary arrangement of the at least one opening 129, specifically of the plurality of openings 129, shown in FIG. 4 can also apply to this alternative way.

FIG. 6A shows the semiconductor in a state in which the at least one opening 129 and the cavity 126 is formed, e.g. by the processes according to FIGS. 3A and 3B. In FIG. 6B, the at least one opening 129 is closed or sealed by a deposition material which can be deposited on the substrate 101a, specifically the first side 101a of the substrate 101. The deposition material can fill the at least one opening 129, providing an auxiliary plug 127. The deposition material, specifically the auxiliary plug 127, can seal the at least one opening 129. According to embodiments, the at least one plug 128 and the at least one auxiliary plug 127 forming together at least one plug for completely closing the cavity. The deposition material can include a metal, such as Ti, TiN, W, Al, AlCu, AlSiCu, Cu, Ta, Co, Pt, Au an oxide, such as TEOS, PSG, BPSG or USG, nitride, carbon, and semiconductor like Si and/or combinations thereof.

As it is illustrated in FIG. 6B, deposition material can also be deposited on portions of the bottom 120a of the recesses 120. Specifically, deposition material can be deposited through the at least one opening 129 as long as it is not closed, forming a reminder layer 234 of deposition material on the bottom 120a of the recesses 120. When practicing embodiments, the used processes can be tuned to avoid a deposition of deposition material on the sidewall 120a of the recesses 120 to avoid shortening of the semiconductor device, specifically of source and drain of the semiconductor device.

As it has become apparent, according to embodiments, the at least one plug further includes at least one opening extending to the cavity, wherein the opening is filled and/or sealed by one of an insulation layer and a conductive layer.

According to embodiments, a method for manufacturing a semiconductor device 100 includes: providing a semiconductor substrate 101 having a first side 101a; forming at least one recess 120 in the semiconductor substrate 101, the at least one recess 120 having a bottom 120a and a sidewall 120b extending from the bottom 120a to the first side 101a of the semiconductor substrate 101; forming an auxiliary structure 123 on the sidewall 120b and the bottom 120a of the at least one recesses 120 and forming a hollow space 125 within the at least one recesses 120; filling the hollow space 125 of the at least one recess 120 with a filling material 122c; forming at least one plug 128 on the first side 101a of the semiconductor substrate 101 to cover the auxiliary structure at least on the sidewall 120b of the at least one recess 120; forming at least one opening 129 in the at least one plug 128 to partially expose the auxiliary structure 123 in the at least one recess 120; removing the auxiliary structure 123 at least partially from the sidewall 120b of the at least one recess 120 to form cavities 126 between the auxiliary structure 123 and the sidewall 120b of the at least one recess 120; and sealing the at least one opening 129 in the at least one plug 128.

According to embodiments, a method for manufacturing a semiconductor device 100 includes: providing a semiconductor substrate 101 having a first side 101a; forming a plurality of recesses 120 in the semiconductor substrate 101, each of the recesses 120 having a bottom 120a and a sidewall 120b extending from the bottom 120a to the first side 101a of the semiconductor substrate 101; forming an insulation structure 123 on the sidewall 120b and the bottom 120a of each of the recesses 120 and forming a hollow space 125 within each of the recesses 120; filling the hollow space 125 of the respective recess 120 with an electrically conductive material for forming respective electrically conducting structures 122 in the recesses 120, each of the electrically conducting structures 122 having a lower end 122a opposite, and specifically spaced from, the bottom 120a of the respective recess 120; forming respective plugs 128 on the first side 101a of the semiconductor substrate 101 to cover the recesses 120, wherein the plugs 128 contacts the electrically conducting structures 122; forming openings 129 in the plugs 128 to partially expose the respective insulation structure 123 in the recesses 120; removing the insulation structures 123 at least partially from the sidewall 120b and the bottom 120a of the respective recesses 120 to form cavities 126 between the electrically conductive structures 123 and the sidewall 120b of the recesses 120; and sealing the openings 129 in the plugs 128.

According to embodiments, a power semiconductor device 100 includes: a semiconductor substrate 101 having a drift region 112; at least one gate electrode trench 130 in the semiconductor substrate 101, extending into the drift region 112 and comprising a gate electrode 132, the gate electrode 132 arranged in the gate electrode trench 130 and electrically insulated from the drift region 112 by a gate dielectric layer 134 arranged between the gate electrode 132 and the drift region 112; and at least one field electrode needle trench 120 in the semiconductor substrate 101, laterally spaced from the gate electrode trench 130 and extending into the drift region 112, the at least one field electrode needle trench 120 comprising a field electrode 122 arranged in the at least one field electrode needle trench 120 and electrically insulated from the drift region 112 by a cavity 126 formed between the field electrode 122 and the drift region 112.

According to embodiments, a power semiconductor device 100 includes: a semiconductor substrate 101 having a drift region 112 and a body region 114; at least one field electrode needle trench 120 in the semiconductor substrate 101 extending into the drift region 112, the at least one field electrode needle trench 120 including a field electrode 122 arranged in the at least one field electrode needle trench 120 and electrically insulated from the drift region 112 by a cavity 126 formed between the field electrode 122 and the drift region 112; at least one electrically conductive plug arranged in an upper portion of the at least one field electrode needle trench 120 and partially closing the cavity on a laterally first side, the at least one electrically conductive plug being in electrical contact with the body region; and at least one auxiliary plug arranged in an upper portion of the at least one field electrode needle trench 120 and closing the cavity on a laterally second side, wherein the electrically at least one conductive plug and the at least one auxiliary plug forming together at least one plug for completely closing the cavity.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
    forming a recess in a semiconductor substrate, the recess having a bottom and a sidewall extending from the bottom to a first side of the semiconductor substrate;
    forming an auxiliary structure on the sidewall and the bottom of the recess and forming a hollow space within the recess;
    filling the hollow space with a filling material;
    forming a plug on the first side of the semiconductor substrate to cover the auxiliary structure at least on the sidewall of the recess;
    forming an opening in the plug to partially expose the auxiliary structure in the recess;
    removing the auxiliary structure at least partially from the sidewall of the recess to form at least one cavity in the recess; and
    sealing the opening in the plug.

2. The method of claim 1, wherein the auxiliary structure is formed to have a first thickness at the bottom of the recess and a second thickness at the sidewall, wherein the first thickness is at least 2-times larger than the second thickness.

3. The method of claim 1, wherein forming the auxiliary structure comprises:
    forming a first auxiliary material on the sidewall of the recess to form a first auxiliary layer; and
    depositing a second auxiliary material on the first auxiliary layer to form a second auxiliary layer.

4. The method of claim 3, wherein the second auxiliary material is deposited by CVD (chemical vapor deposition), HDP CVD (high-density plasma chemical vapor deposition), TEOS (Tetraethyl Orthosilicate) deposition, or PSG (phosphosilicate glass) deposition.

5. The method of claim 1, wherein the recess is formed to have an aspect ratio of depth to smallest lateral extension of at least 2:1.

6. The method of claim 1, wherein the plug is formed of an electrically conductive material which is in contact with the filling material.

7. The method of claim 6, wherein the opening is sealed by thermal oxidation.

8. The method of claim 1, wherein the opening is sealed by BPSG (borophosphosilicate glass) reflow.

9. The method of claim 8, further comprising;
    depositing a BPSG (borophosphosilicate glass) layer and etching the BPSG layer in areas corresponding to the opening prior to forming the opening.

10. The method of claim 1, wherein the opening is sealed by deposition of a sealing material.

11. The method of claim 1, further comprising:
    forming a doping region in the semiconductor substrate; and
    forming an electrical connection between the doping region and the filling material in the recess.

12. The method of claim 1, wherein the auxiliary structure is removed from the sidewall and the bottom of the recess so that the filling material is detached from the bottom and the sidewall of the recess.

13. The method of claim 1, further comprising:
    forming a trench in the semiconductor substrate, the trench having a bottom and a sidewall extending from the bottom to the first side of the semiconductor substrate, the trench having a depth which is less than a depth of the recess;
    forming a gate dielectric on the sidewall and the bottom of the trench; and
    forming a gate electrode on the gate dielectric in the trench.

14. The method of claim 13, wherein the trench is laterally spaced from the recess, and wherein the trench is formed to have a smallest lateral dimension which is less than a smallest lateral dimension of the recess.

15. The method of claim 13, wherein the trench is formed after forming the recess.

16. A power semiconductor device, comprising:
    a semiconductor substrate having a drift region;
    a gate electrode trench in the semiconductor substrate, extending into the drift region and comprising a gate electrode arranged in the gate electrode trench and electrically insulated from the drift region by a gate dielectric layer arranged between the gate electrode and the drift region; and
    a field electrode needle trench in the semiconductor substrate, laterally spaced from the gate electrode trench and extending into the drift region, the field electrode needle trench comprising a field electrode arranged in the field electrode needle trench and electrically insulated from the drift region by a cavity formed in the field electrode needle trench between the field electrode and the drift region.

17. The power semiconductor device of claim 16, further comprising a plug on a first side of the semiconductor substrate, wherein the plug closes an upper portion of the recess and contacts the field electrode.

18. The power semiconductor device of claim 17, wherein the plug comprises an electrically conductive material and is in electrical contact with the field electrode.

19. The power semiconductor device of claim 18, wherein the plug further comprises an opening extending to the cavity, wherein the opening is filled and sealed by one of an insulation layer and a conductive layer.

20. The power semiconductor device of claim 16, further comprising a body region over the drift region, wherein the gate electrode trench and the field electrode needle trench extend through the body region.

21. The power semiconductor device of claim 20, wherein the plug is in electrical contact with the body region.

22. The power semiconductor device of claim 16, wherein the field electrode is spaced from a bottom of the field electrode needle trench without being in contact with the bottom of the field electrode needle trench.

23. The power semiconductor device of claim 16, wherein the field electrode is spaced from a bottom of the field electrode needle trench, and wherein an auxiliary structure mechanically connects the bottom of the field electrode and the bottom of the field electrode needle trench.

24. A power semiconductor device, comprising:
- a semiconductor substrate having a drift region and a body region;
- a field electrode needle trench in the semiconductor substrate extending into the drift region, the field electrode needle trench comprising a field electrode arranged in the field electrode needle trench and electrically insulated from the drift region by a cavity formed between the field electrode and the drift region;
- an electrically conductive plug arranged in an upper portion of the field electrode needle trench and partially closing the cavity on a laterally first side, the electrically conductive plug being in electrical contact with the body region; and
- an auxiliary plug arranged in an upper portion of the field electrode needle trench and closing the cavity on a laterally second side,
- wherein the electrically conductive plug and the auxiliary plug together completely close the cavity.

* * * * *